(12) United States Patent  (10) Patent No.: US 7,581,308 B2
Finn  (45) Date of Patent: Sep. 1, 2009

(54) METHODS OF CONNECTING AN ANTENNA TO A TRANSPONDER CHIP

(75) Inventor: David Finn, Tourmakeady (IE)

(73) Assignee: Advanced Microelectronic and Automation Technology Ltd., Tourmakeady, County Mayo (IE)

( * ) Notice: Subject to any disclaimer, the term of this patent is extended or adjusted under 35 U.S.C. 154(b) by 102 days.

(21) Appl. No.: 11/773,434

(22) Filed: Jul. 5, 2007

(65) Prior Publication Data

US 2008/0155822 A1  Jul. 3, 2008

Related U.S. Application Data

(63) Continuation-in-part of application No. 11/760,793, filed on Jun. 11, 2007.

(60) Provisional application No. 60/883,064, filed on Jan. 1, 2007, provisional application No. 60/884,158, filed on Jan. 9, 2007, provisional application No. 60/887,294, filed on Jan. 30, 2007, provisional application No. 60/894,469, filed on Mar. 13, 2007, provisional application No. 60/938,454, filed on May 17, 2007.

(51) Int. Cl.
*H01P 11/00* (2006.01)
*H01Q 13/00* (2006.01)

(52) U.S. Cl. ............... 29/600; 29/832; 29/843; 29/592.1; 343/873; 343/700 MS

(58) Field of Classification Search ........... 29/600, 29/601, 840, 847, 846, 831; 343/700 MS, 343/767, 846; 340/572.5, 572.7; 235/492, 235/442

See application file for complete search history.

(56) References Cited

U.S. PATENT DOCUMENTS

| 3,674,914 | A | 7/1972 | Burr |
| 4,437,603 | A | 3/1984 | Kobayashi et al. |
| 4,533,787 | A | 8/1985 | Anderegg et al. |
| 4,641,773 | A | 2/1987 | Morino et al. |
| 4,693,778 | A | 9/1987 | Swiggett et al. |
| 4,730,188 | A | 3/1988 | Milheiser |
| 4,884,334 | A | 12/1989 | Houser et al. |
| 4,912,143 | A | 3/1990 | Ahn et al. |

(Continued)

FOREIGN PATENT DOCUMENTS

CA  2555034  9/2005

(Continued)

*Primary Examiner*—Minh Trinh
(74) *Attorney, Agent, or Firm*—Gerald E. Linden; Dwight A. Stauffer

(57) ABSTRACT

Method of connecting an antenna wire to a transponder chip. A transponder chip in a recess in a substrate, and an antenna wire mounted to the surface of the substrate and having end portions spanning the recess. The end portions are spaced wider than the chip, to allow the chip to be inserted into the recess from the same side as the antenna. The end portions may then be repositioned to be over corresponding terminals of the chip, for bonding thereto. The recess may be substantially larger than the chip, so that the chip and/or the substrate may be moved from side-to-side in the recess for positioning the terminals under the end portions, for bonding thereto. Insulation may be removed from the end portions prior to mounting the chip in the recess, to enhance subsequent bonding.

20 Claims, 6 Drawing Sheets

U.S. PATENT DOCUMENTS

| | | | |
|---|---|---|---|
| 5,041,826 A | 8/1991 | Milheiser | |
| 5,083,087 A | 1/1992 | Fox et al. | |
| 5,094,907 A | 3/1992 | Yamamura et al. | |
| 5,166,676 A | 11/1992 | Milheiser | |
| 5,201,453 A | 4/1993 | Amador et al. | |
| 5,211,129 A | 5/1993 | Taylor et al. | |
| 5,281,855 A | 1/1994 | Hadden et al. | |
| 5,340,946 A | 8/1994 | Friedrich et al. | |
| 5,365,657 A | 11/1994 | Brown et al. | |
| 5,491,302 A | 2/1996 | Distefano et al. | |
| 5,566,441 A * | 10/1996 | Marsh et al. | 29/600 |
| 5,598,032 A * | 1/1997 | Fidalgo | 343/873 |
| 5,773,812 A | 6/1998 | Kreft | |
| 5,809,633 A | 9/1998 | Mundigl et al. | |
| 6,008,993 A | 12/1999 | Kreft | |
| 6,088,230 A | 7/2000 | Finn et al. | |
| 6,095,423 A | 8/2000 | Houdeau et al. | |
| 6,095,915 A | 8/2000 | Geissler | |
| 6,107,920 A | 8/2000 | Eberhardt et al. | |
| 6,140,707 A | 10/2000 | Plepys et al. | |
| 6,142,381 A | 11/2000 | Finn et al. | |
| 6,190,942 B1 | 2/2001 | Wilm et al. | |
| 6,206,292 B1 | 3/2001 | Robertz et al. | |
| 6,233,818 B1 * | 5/2001 | Finn et al. | 29/843 |
| 6,259,369 B1 | 7/2001 | Monico | |
| 6,288,443 B1 | 9/2001 | Finn et al. | |
| 6,310,778 B1 | 10/2001 | Finn et al. | |
| 6,471,878 B1 | 10/2002 | Greene et al. | |
| 6,521,829 B2 | 2/2003 | Matsumura et al. | |
| 6,606,247 B2 | 8/2003 | Credelle et al. | |
| 6,626,364 B2 | 9/2003 | Taban | |
| 6,628,240 B2 | 9/2003 | Amadeo | |
| 6,667,092 B1 | 12/2003 | Brollier et al. | |
| 6,677,917 B2 | 1/2004 | Van Heerden et al. | |
| 6,698,089 B2 | 3/2004 | Finn et al. | |
| 6,810,580 B2 * | 11/2004 | Yamaguchi et al. | 29/748 |
| 6,870,497 B2 | 3/2005 | Kondo et al. | |
| 6,956,182 B2 | 10/2005 | Gregory | |
| 7,011,980 B1 | 3/2006 | Na et al. | |
| 7,176,053 B1 | 2/2007 | Dimmler | |
| 2002/0020903 A1 | 2/2002 | Kreft et al. | |
| 2004/0089707 A1 | 5/2004 | Cortina et al. | |
| 2004/0155114 A1 | 8/2004 | Rietzler | |
| 2005/0206524 A1 | 9/2005 | Forster et al. | |
| 2005/0282355 A1 | 12/2005 | Edwards et al. | |
| 2005/0282495 A1 | 12/2005 | Forster | |
| 2006/0114109 A1 | 6/2006 | Geissler | |
| 2007/0130754 A1 | 6/2007 | Fein | |
| 2007/0290051 A1 | 12/2007 | Bielmann et al. | |

FOREIGN PATENT DOCUMENTS

| | | |
|---|---|---|
| DE | 28 11 458 | 2/1979 |
| DE | 36 22 246 | 1/1987 |
| DE | 42 05 084 | 9/1993 |
| DE | 195 25 933 | 1/1997 |
| DE | 195 41 039 | 5/1997 |
| DE | 196 10 507 | 9/1997 |
| DE | 196 16 424 | 10/1997 |
| DE | 196 54 902 | 10/1997 |
| DE | 196 34 473 | 1/1998 |
| DE | 196 46 717 | 5/1998 |
| DE | 196 51 566 | 6/1998 |
| DE | 197 16 912 | 11/1998 |
| DE | 197 41 984 | 6/1999 |
| DE | 198 50 353 | 3/2000 |
| DE | 199 20 593 | 11/2000 |
| DE | 10 2004 043 747 | 3/2006 |
| DE | 20 2005 016 382 | 3/2006 |
| DE | 20 2007 013680 | 1/2008 |
| GB | 1 593 235 | 7/1981 |
| JP | 6-351194 A | 12/1994 |
| WO | WO 91 16718 | 10/1991 |
| WO | WO 95 26538 | 10/1995 |
| WO | WO 97 30418 | 8/1997 |
| WO | WO 97 35273 | 9/1997 |
| WO | WO 00/21030 | 4/2000 |
| WO | WO 00/36891 | 6/2000 |
| WO | WO 00 68994 | 11/2000 |
| WO | WO 2006 050691 | 5/2006 |

* cited by examiner

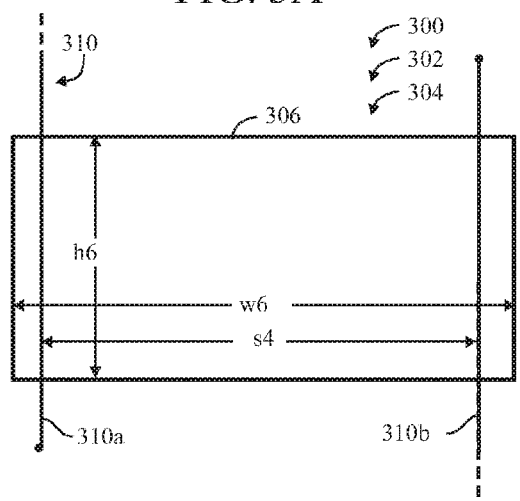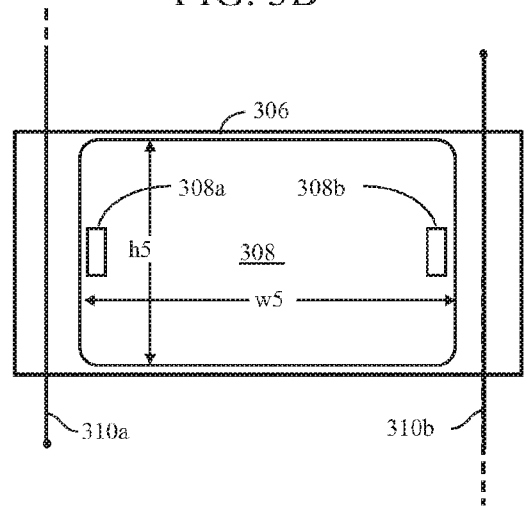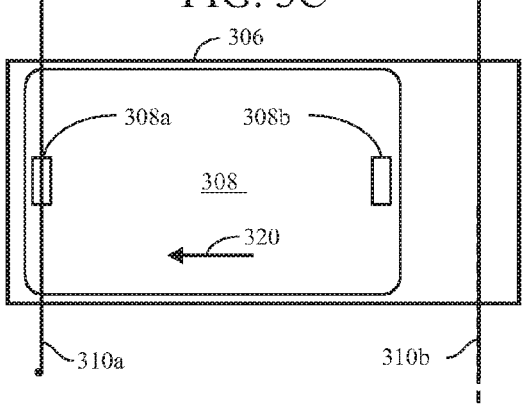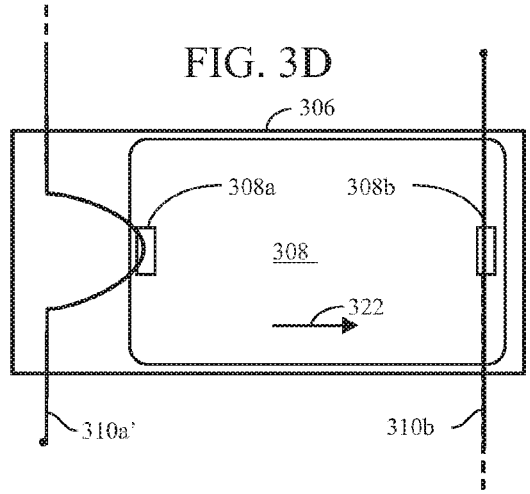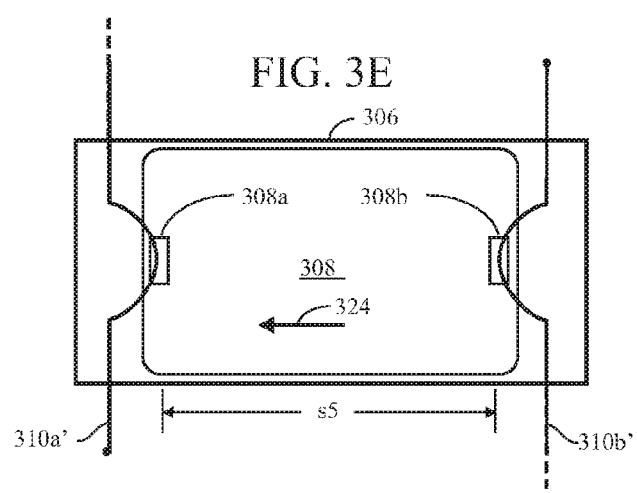

METHODS OF CONNECTING AN ANTENNA TO A TRANSPONDER CHIP

CROSS-REFERENCE TO RELATED APPLICATIONS

This patent application claims benefit of the following U.S. Provisional and/or non-provisional patent applications, all of which are incorporated by reference in their entirety herein:

60/883,064 filed 1 Jan. 2007 by Finn (hereinafter "S5" provisional),

60/884,158 filed 9 Jan. 2007 by Finn (hereinafter "S6" provisional),

60/887,294 filed 30 Jan. 2007 by Finn (hereinafter "S7" provisional),

60/894,469 filed 13 Mar. 2007 by Finn (hereinafter "S8" provisional),

60/938,454 filed 17 May 2007 by Finn (hereinafter "S11" provisional), and

Ser. No. 11/760,793 filed Jun. 11, 2007 by Finn (hereinafter "S10" non-provisional).

FIELD OF THE INVENTION

The invention relates to techniques for interconnection of lead wires to an integrated circuit (IC), such as in the context of an inlay having a wire which is an antenna wire mounted such as by embedding the wire to the surface of a substrate, followed by bonding end portions of the antenna wire to terminals (bond pads) of a transponder IC disposed in a recess in the substrate.

BACKGROUND OF THE INVENTION

U.S. Pat. No. 5,281,855, incorporated by reference in its entirety herein, discloses a method and apparatus for facilitating interconnection of lead wires to an integrated circuit including the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique.

U.S. Pat. No. 6,088,230, incorporated by reference in its entirety herein, discloses a procedure for producing a transponder unit (55) provided with at least one chip (16) and one coil (18), and in particular a chip card/chip-mounting board (17) wherein the chip and the coil are mounted on one common substrate (15) and the coil is formed by installing a coil wire (21) and connecting the coil-wire ends (19, 23) to the contact surfaces (20, 24) of the chip on the substrate.

U.S. Pat. No. 6,698,089, incorporated by reference in its entirety herein, discloses a device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area by a wire guide and a portal, and in a second phase the connection of the wire conductor (113) to the terminal area (118,119) is effected by means of a connecting instrument (125). See also U.S. Pat. No. 6,233,818, incorporated by reference in its entirety herein.

Canada Patent Application CA 2555034 discloses a method for the production of a book-type security document with at least one security cambric (15) and at least one transponder unit (21), characterized in that: at least one laminated layer (22, 23) is applied at least on one side of the at least one security cambric (4 5) and on at least one side of the at least one transponder unit (21); the at least one security cambric (15) and the at least one transponder unit (21) are fully encompassed by the laminated layers (22, 23) and that a circumferential, closed edge (24) is provided by the laminated layers (22, 231, and that a laminated layer sheath (25) is formed.

U.S. Pat. No. 7,229,022 discloses method for producing a contactless chip card and chip card. A method for producing a transponder, especially a contactless chip card (1) comprises at least one electronic component (chip module 2) and at least one antenna (3); the at least one electronic chip component (2) being disposed on a non-conducting substrate that serves as a support for the component. The at least one antenna is also disposed on a non-conducting substrate, the at least one electronic component (2) being applied to a first substrate and the antenna (3) on a second substrate. The entire circuit (1) is then produced by joining the individual substrates so that they are correctly positioned relative to each other. The components (2, 3) are contacted once the different substrates have been joined by means of auxiliary materials such as solder or glue, or without auxiliary materials by microwelding. The non-conducting substrates form a base card body.

DEFINITIONS

As used herein, an "inlay" is a generally planar substrate (or sheet), which may include several (a plurality of) distinct "transponder areas" (or "transponder sites"), arranged for example in a 3×6 array on the planar substrate. The inlay sheet may have one or more (multiple) layers, including one or more "top layers" and one or more "bottom layers". A "transponder" may be fabricated in each "transponder area". Each "transponder" may include an antenna, which is mounted to a surface (such as a top layer) of the substrate, and a "transponder chip" which is installed at a "transponder chip site" (or "site for the transponder chip") on the substrate. The antenna is typically in the form of a flat coil having two ends, which are connected to bond pads (terminals) on the "transponder chip". The "transponder chip" may be an individual integrated circuit (IC) chip, or a chip module (such as a chip mounted to a small substrate or a carrier). The "transponder chip site" of the "transponder" ("transponder area" of the "inlay sheet") may comprise a recess (or window, or opening) extending through the top and one or more underlying layers of the substrate, such that the "transponder chip" can be installed in the recess, submerged below (or even with) the top surface of the planar substrate and supported by an underlying layer of the planar substrate. A window may extend completely through the planar substrate so that a transponder chip or chip module may be installed from an opposite (from the antenna) side of the planar substrate.

As used herein, the word "chip" can encompass many configurations of a silicon die or a packaged chip. The silicon die for example can have metalized bumps to facilitate the direct connection of the wire ends of an antenna to form a transponder or tag device. A packaged chip can include various structures such as a tape automated bonding module, a chip module, a flip chip module, a lead frame, a chip carrier, a strap, an interposer or any form of packaging to facilitate transponder manufacturing.

Regarding metalized bumps on chips, normally chips (also referred to as "dice", plural of "die") have aluminum pads 100×100 microns in dimension. Gold bumps may be sputtered or plated onto the aluminum pads and rise 25 microns above the pads. Enhanced pads or so-called "mega bumps" can be large and can be mounted over the active structure of a die.

An inlay substrate typically has a plurality, such as an array of transponder sites on a substrate which matches the position of the data or graphics on a printed sheet or holder/cover page of a smart card or electronic passport respectively. An "inlay" is generally a semi-finished product that requires additional layers of material (e.g., printed sheet) to complete a "final product" (e.g., electronic passport or smart card).

An inlay with an array of transponder sites may be produced by placing sheets of synthetic material or coated paper on top of each other with an antenna or antennae and electronic components at each site sandwiched between layers of sheet material. To integrate the electronic components such as an RFID chip module, a cavity at each site is punched into one or more of the top layers, in order to protect the chip modules during hot lamination.

"RFID" is short for "Radio Frequency Identification". An RFID device interacts, typically at a limited distance, with a "reader", and may be either "passive" (powered by the reader) or "active" (having its own power source, such as a battery). As used herein, a transponder may comprise an RFID chip (either passive or active) connected to an antenna. (A "transponder chip" may be an "RFID chip".)

An Inlay and Transponder of the Prior Art

FIGS. 1A and 1B illustrate an inlay substrate (or sheet) 100 having a plurality of transponder areas. A selected one of the transponder areas 102 constituting a single transponder is shown in detail. The vertical and horizontal dashed lines (in FIG. 1A) are intended to indicate that there may be additional transponder areas (and corresponding additional transponders) disposed to the left and right of, as well as above and below, the transponder area 102, on the inlay sheet 100. Such a plurality of transponders may be arranged in an array on the (larger) inlay sheet. As best viewed in FIG. 1B, the inlay sheet 100 may be a multi-layer substrate 104 comprising one or more upper (top) layers 104a and one or more lower (bottom) layers 104b.

A recess 106 may be formed in the upper layer 104a, at a "transponder chip site", so that a transponder chip 108 may be disposed in the recess, and supported by the lower layer 104b. The transponder chip 108 is shown having two terminals 108a and 108b on a top surface thereof.

Generally, the recess 106 is sized and shaped to accurately position the transponder chip 108, having side dimensions only slightly larger than the transponder chip 108 to allow the transponder chip 108 to be located within the recess. For example, the transponder chip 108 may measure: 5.0×8.0 mm the recess 106 may measure: 5.1×8.1 mm the terminals 108a/b may measure: 5.0×1.45 mm the wire (discussed below) may have a diameter between 60 and 112 μm One millimeter (mm) equals one thousand (1000) micrometers (μm, "micron").

In FIGS. 1A and 1B, the recess 106 may be illustrated with an exaggerated gap between its inside edges and the outside edges of the chip 108, for illustrative clarity. In reality, the gap may be only approximately 50 μm-100 μm (0.05 mm-0.1 mm).

In FIG. 1A the terminals 108a and 108b are shown reduced in size (narrower in width), for illustrative clarity. (From the dimensions given above, it is apparent that the terminals 108a and 108b can extend substantially the full width of the transponder chip 108.)

It should be understood that the transponder chip 108 is generally snugly received within the recess 106, with dimensions suitable that the chip 108 does not move around after being located within the recess 106, in anticipation of the wire ends 110a, 110b being bonded to the terminals 108a, 108b. As noted from the exemplary dimensions set forth above, only very minor movement of the chip 108, such as a small fraction of a millimeter (such as 50 μm-100 μm) can be tolerated. In relative terms, the gap between the inside edge of the recess 106 (e.g., 0.1 mm) and a side edge of the chip 108 is only approximately up to 2% of a chip dimension. (0.1/5.0=2%; 0.1/8.0=1.25%; 0.05/5.0=1%; 0.05/8.0=0.6%).

As best viewed in FIG. 1A, an antenna wire 110 is disposed on a top surface (side) of the substrate, and may be formed into a flat (generally planar) coil, having two end portions 110a and 110b.

As best viewed in FIG. 1B, the antenna wire is "mounted" to the substrate, which includes "embedding" (countersinking) the antenna wire into the surface of the substrate, or "adhesively placing" (adhesively sticking) the antenna wire on the surface of the substrate. In either case (embedding or adhesively placing), the wire typically feeds out of a capillary 116 of an ultrasonic wire guide tool (not shown). The capillary 116 is typically disposed perpendicular to the surface of the substrate 100. The capillary 116 is omitted from the view in FIG. 1A, for illustrative clarity.

The antenna wire may be considered "heavy" wire (such as 60 μm) and requires higher bonding loads than those used for "fine" wire (such as 30 μm). Rectangular section copper ribbon (such as 60×30 μm) can be used in place of round wire.

The capillary 116 may be vibrated by an ultrasonic vibration mechanism (not shown), so that it vibrates in the vertical or longitudinal (z) direction, such as for embedding the wire in the surface of the substrate, or in a horizontal or transverse (y) direction, such as for adhesively placing the wire on the surface of the substrate. In FIG. 1B, the wire 110 is shown slightly spaced (in drawing terminology, "exploded" away) from the substrate, rather than having been embedded (countersunk) in or adhesively placed (stuck to) on the surface of the substrate.

The antenna wire 110 may be mounted in the form of a flat coil, having two ends portions 110a and 110b. The ends portions 110a and 110b of the antenna coil wire 110 are shown extending over (FIG. 1A) and may subsequently be connected, such as by thermal-compression bonding (not shown), to the terminals 108a and 108b of the transponder chip 108, respectively.

Examples of embedding a wire in a substrate, in the form of a flat coil, and a tool for performing the embedding (and a discussion of bonding), may be found in the aforementioned U.S. Pat. No. 6,698,089 (refer, for example, to FIGS. 1, 2, 4, 5, 12 and 13 of the patent). It is known that a coated, self-bonding wire will stick to a synthetic (e.g., plastic) substrate because when vibrated sufficiently to soften (make sticky) the coating and the substrate.

In FIG. 1B, the wire 110 is shown slightly spaced (in drawing terminology, "exploded" away) from the terminals 108a/b of the transponder chip 108, rather than having been bonded thereto, for illustrative clarity. In practice, this is generally the situation—namely, the end portions of the wires span (or bridge), the recess slightly above the terminals to which they will be bonded, in a subsequent step. Also illustrated in FIG. 1B is a "generic" bond head, poised to move down (see arrow) onto the wire 110b to bond it to the terminal 108b. The bond head 118 is omitted from the view in FIG. 1A, for illustrative clarity.

The interconnection process can be inner lead bonding (diamond tool), thermal compression bonding (thermode), ultrasonic bonding, laser bonding, soldering, ColdHeat soldering (Athalite) or conductive gluing.

As best viewed in FIG. 1A, in case the antenna wire 110 needs to cross over itself, such as is illustrated in the dashed-line circled area "c" of the antenna coil, it is evident that the wire should typically be an insulated wire, generally comprising a metallic core and an insulation (typically a polymer) coating. Generally, it is the polymer coating that facilitates the wire to be "adhesively placed" on (stuck to) a plastic substrate layer. (It is not always the case that the wire needs to cross over itself. See, for example, FIG. 4 of U.S. Pat. No. 6,698, 089).

In order to feed the wire conductor back and forth through the ultrasonic wire guide tool, a wire tension/push mechanism (not shown) can be used or by application of compressed air it is possible to regulate the forward and backward movement of the wire conductor by switching the air flow on and off which produces a condition similar to the Venturi effect.

By way of example, the wire conductor can be self-bonding copper wire or partially coated self bonding copper wire, enamel copper wire or partially coated enamel wire, silver coated copper wire, un-insulated wire, aluminum wire, doped copper wire or litz wire.

By way of example, the substrate can be PVC, PC, PE, PET, PETE, TYVEK, TESLIN, C-FLEX, Paper or Cotton/Noil. The substrate can also have special markings such as luminous threads, water marks, microscopic filings and optical polymer memory for additional security.

FIG. 1A herein resembles FIG. 5 of U.S. Pat. No. 6,698, 089 (the '089 patent), which has a similar coil antenna (50) with an initial coil region (51) and a final coil region (52) comparable to the antenna 110 with two end portions 110a and 110b described herein. In the '089 patent, the coil (50) is arranged on a substrate 55 which comprises a substrate recess (56, compare 106 herein) in the interior region (53) of the coil (50).

In FIG. 5 of the '089 patent, it can be seen that the initial and final coil regions (end portions) of the wires extend across the recess. In FIG. 6 of the '089 patent, it can be seen that the recess extends completely through the substrate. If the antenna is mounted to the substrate prior to the chip being installed in the recess (and the antenna is mounted to the front/top surface/side of the substrate, as shown), due to the fact that the antenna wires are "blocking" entry to the recess from the top/front surface of the substrate, the chip must be installed into the recess from the back (bottom) side of the substrate, as indicated by FIG. 6 of the '089 patent.

FIG. 7 of the '089 patent shows the subsequent (inter) connection of the terminal areas 59 of the chip unit 58 to the initial coil region 51 and to the final coil region 52 by means of a thermode 60 which under the influence of pressure and temperature creates a connection by material closure between the wire conductor 20 and the terminal areas 59, as an overall result of which a card module 64 is formed.

GLOSSARY & DEFINITIONS

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

Chip As used herein, the word "chip" can encompass many configurations of a silicon die or a packaged chip. The silicon die for example can have metalized bumps to facilitate the direct connection of the wire ends of an antenna to form a transponder. A packaged chip can include various structures such as a tape automated bonding module, a chip module, a flip chip module, a lead frame, a chip carrier, a strap, an interposer or any form of packaging to facilitate transponder manufacturing.

Inlay An inlay substrate typically has a plurality, such as array of transponder sites on a substrate which matches the position of the data or graphics on a printed sheet or holder/cover page of a smart card or electronic passport respectively.

Litz wire Litz Wire is a special type of wire used in electronics. It consists of many thin wires, individually coated with an insulating film and braided, thus increasing the surface area of the conductor and thereby reducing the skin effect and associated power losses when used with high-frequency applications.

PVC short for polyvinyl chloride, (IUPAC Polychloroethene). PVC is a widely used thermoplastic polymer. It can be made softer and more flexible by the addition of plasticizers, the most widely used being phthalates.

PET short for Polyethylene terephthalate (also known as PET, PETE or the obsolete PETP or PET-P). PET is a thermoplastic polymer resin of the polyester family that produced by the chemical industry and is used in synthetic fibers; beverage, food and other liquid containers; thermoforming applications; and engineering resins often in combination with glass fiber. It is one of the most important raw materials used in man-made fibers.

PETE see PET.

Teslin™ Teslin is a synthetic printing media, manufactured by PPG Industries. Teslin is a waterproof synthetic material that works well with an Inkjet printer, Laser printer, or Thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 mil, though only sizes 10 mil and 14 mil are sized at 8.5" by 11", for printing with most consumer printers. Also available are perforated versions of Teslin, specifically, 2 up, 6 up, and 8 up.

Tyvek™ Tyvek is a brand of spunbonded olefin, a synthetic material made of high-density polyethylene fibers; the name is a registered trademark of the DuPont Company. The material is very strong; it is difficult to tear but can easily be cut with scissors or any other sharp object. Water vapor can pass through Tyvek, but not liquid water, so the material lends itself to a variety of applications: medical packaging, envelopes, car covers, air and water intrusion barriers (housewrap) under house siding, labels, wristbands, mycology, and graphics.

RFID Short for "Radio Frequency Identification". An RFID device interacts, typically at a limited distance, with a "reader", and may be either "passive" (powered by the reader) or "active" (having its own power source, such as a battery).

Transponder As used herein, a transponder is an RFID chip (either passive or active) connected to an antenna.

BRIEF DESCRIPTION (SUMMARY) OF THE INVENTION

Generally, the invention relates to mounting an antenna wire to a substrate with end portions of the antenna wire bridging a recess in the substrate, and initially spaced farther apart than a width dimension of a chip (or chip module) which can be inserted into the recess, past the spaced-apart "wire bridges". Then, the wire bridges are moved closer together in preparation for bonding to corresponding terminals of the chip. This can be done "directly", by moving the wire bridges themselves. Or, with a recess that is substantially larger than the chip, a relative movement can be imparted between the chip and the substrate, by moving the chip and/or the substrate, so that the chip terminals are sequentially positioned under corresponding ones of the wire bridges, for bonding thereto.

The substrate may be a multi-layer substrate, and the recess may extend only partially through the substrate so that the chip is supported on lower layer(s) of the substrate. Or, the recess may extend fully through the substrate. Or, the recess may extend only partially through the substrate, and "slot" extensions of the recess extend through the substrate.

Prior to disposing the chip in the recess, insulation may be removed from the wire bridges to facilitate subsequent bonding of the wire bridges to the corresponding terminals of the chip.

A method of connecting an antenna wire to a transponder chip comprises: providing a recess in a surface of a substrate; mounting the antenna wire to the surface of the substrate so that two end portions of the antenna wire span the recess; characterized by: the end portions of the antenna wire are spaced a distance apart from one another, wherein the distance is greater than a width dimension of the transponder chip, so that the transponder chip may be disposed in the recess after the antenna wire is mounted to the surface of the substrate; repositioning at least one of the end portions so that the two end portions are located directly over corresponding two terminals of the transponder chip. The two end portions of the antenna wire may subsequently be connected to the corresponding two terminals of the transponder chip.

The end portions of the wire may be repositioned directly to be over the corresponding two terminals of the transponder chip, by using a gripper tool or hook to move (re-position, stretch, deform) the wire.

A first relative motion may be imparted between the chip and the substrate so that a first terminal of the chip is positioned under a first end portion of the wire, and the wire is bonded to the terminal. Then, a second relative motion may be imparted between the chip and the substrate so that the second terminal of the chip (308, 408) is positioned under the second end portion of the wire, and the wire is bonded to the terminal. After both wire bridges are bonded to the corresponding two terminals of the chip, a third relative motion may be imparted between the chip and the substrate to center the chip in the recess. The relative motions referred to herein may be achieved by moving the chip (with the substrate stationary) and/or by moving the substrate (with the chip stationary). In either case, the substrate has the antenna wire mounted thereto with its end portions spanning the recess, so by imparting a relative motion between the chip and the substrate, a corresponding relative motion between the chip and the antenna wire (notably, the end portions of the antenna wire) can be achieved. To allow for this relative motion, the recess may have a width dimension which is significantly greater than a width dimension of the chip, including at least 20% greater, at least 25% greater, at least 30% greater, at least 40% greater, at least 50% greater, at least 60% greater.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
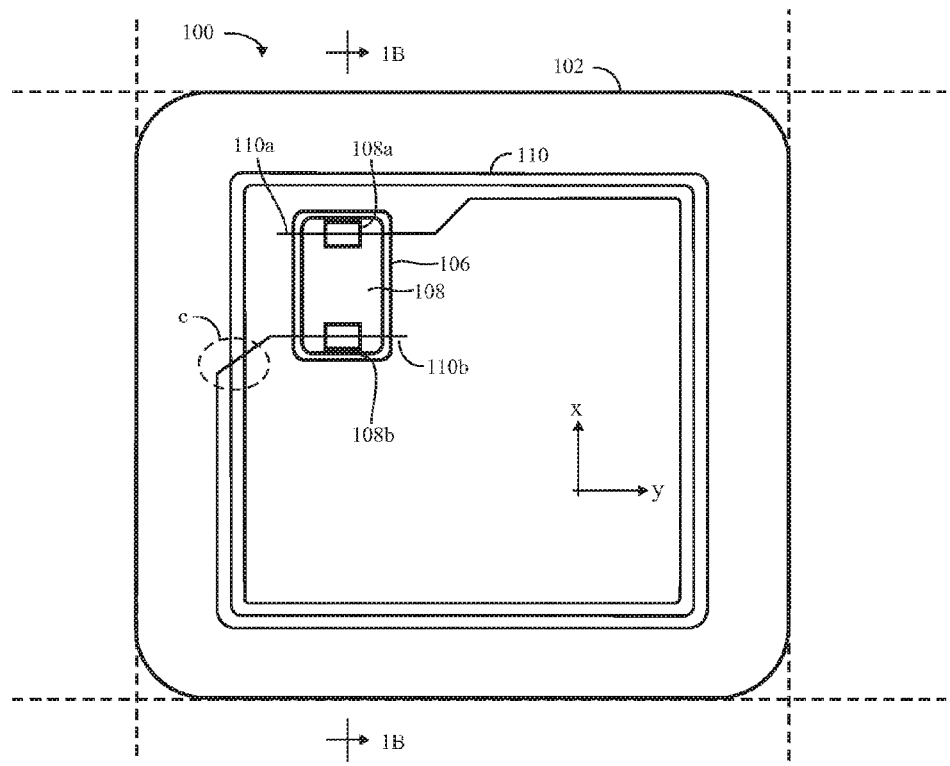

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1A is a top view of a transponder site, according to the prior art.

Figure 1B:
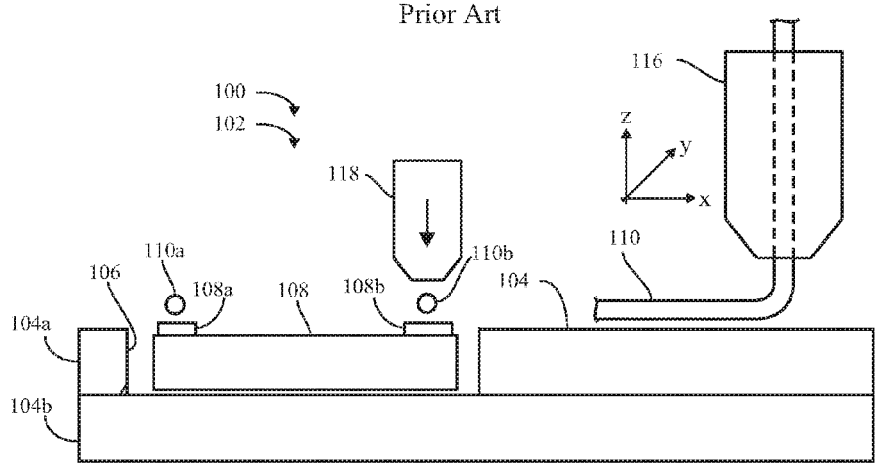

FIG. 1B is a side, cross-sectional view, partially exploded, of a wire being mounted to the substrate of FIG. 1A (and bonded to the terminals of the chip), according to the prior art.

Figure 1C:
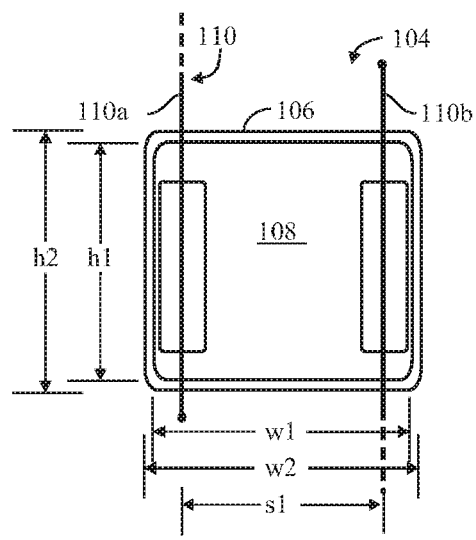

FIG. 1C is a top view of a portion of a transponder site, showing transponder chip mounted in a recess, and end portions of an antenna wire bonded to respective terminals of the transponder chip, according to the prior art.

Figure 2A:
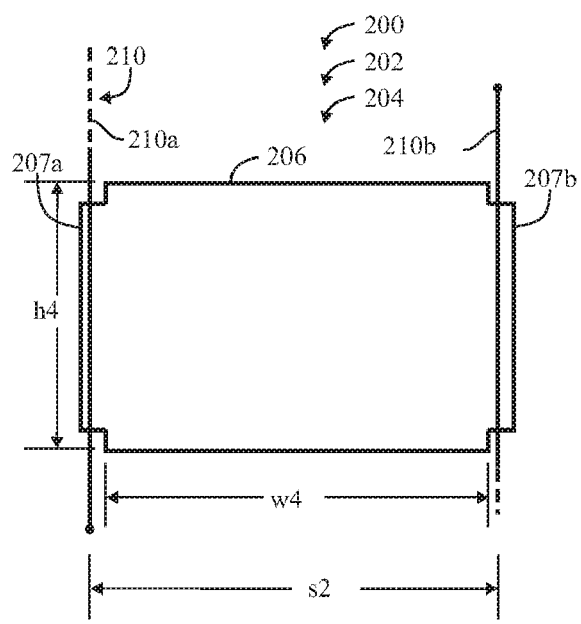

FIG. 2A is a top view of a portion of a transponder site, showing a recess and an antenna wire having end portions spanning (bridging) the recess, according to an embodiment of the invention.

Figure 2B:
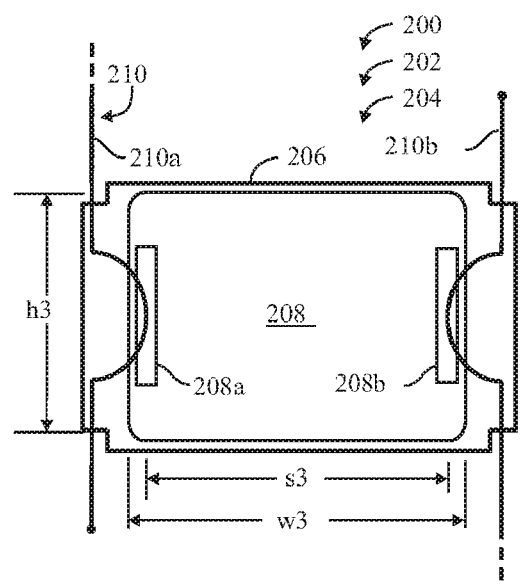

FIG. 2B is a top view of a portion of a transponder site of FIG. 2A, showing a transponder chip mounted in the recess, and the end portions of the antenna wire bonded to respective terminals of the transponder chip.

FIGS. 3A-3E are top views of a recess in a substrate, and a method of connecting an antenna mounted on the substrate to a chip disposed in the recess, according to an embodiment of the invention.

FIGS. 4A-4E are cross-sectional views of a recess in a substrate, and a method of connecting an antenna mounted on the substrate to a chip disposed in the recess, according to an embodiment of the invention.

Figure 5A:
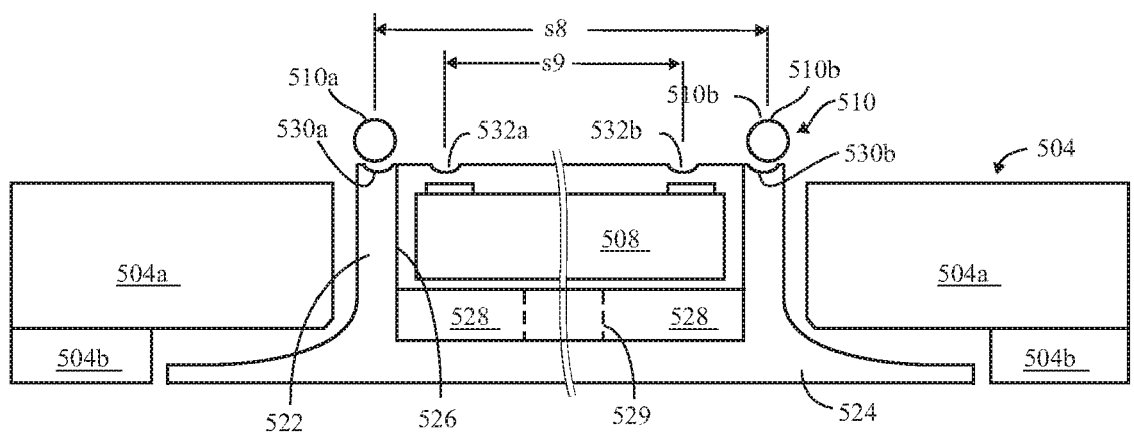
Figure 5B:
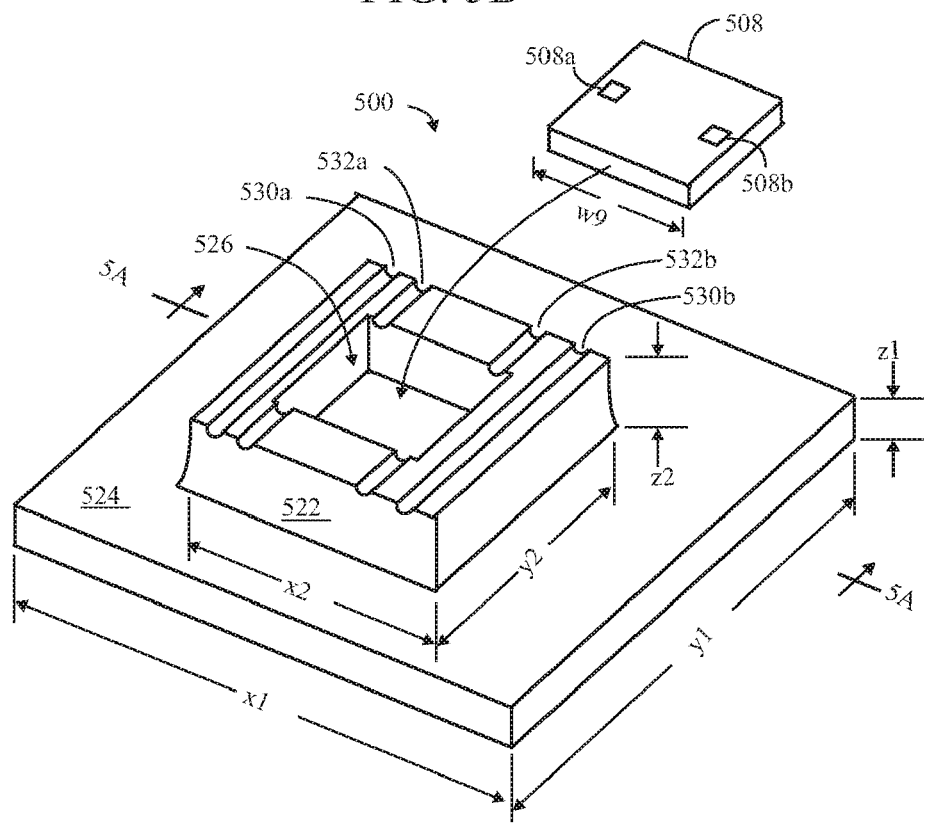

FIG. 5A is a cross-sectional view of a die in a mold mass, taken on a line 5A-5Y through FIG. 5B, according to an embodiment of the invention.

FIG. 5B is a perspective view of the die in a mold mass shown in FIG. 5A.

Figure 6A:
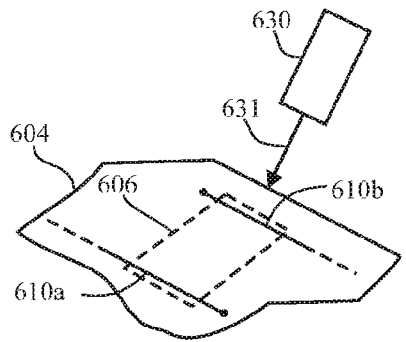

FIG. 6A is a perspective view of a technique for removing insulation from wire bridges, according to an aspect of the invention.

Figure 6B:
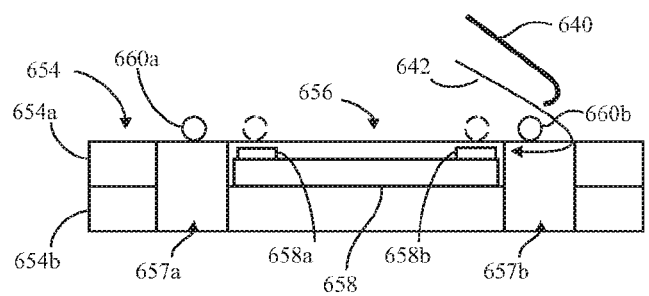

FIG. 6B is a cross-sectional view of an inlay with a chip with wire bridges passing over slots and being manipulated (repositioned) over terminals of a transponder chip, according to an embodiment of the invention.

Figure 7:
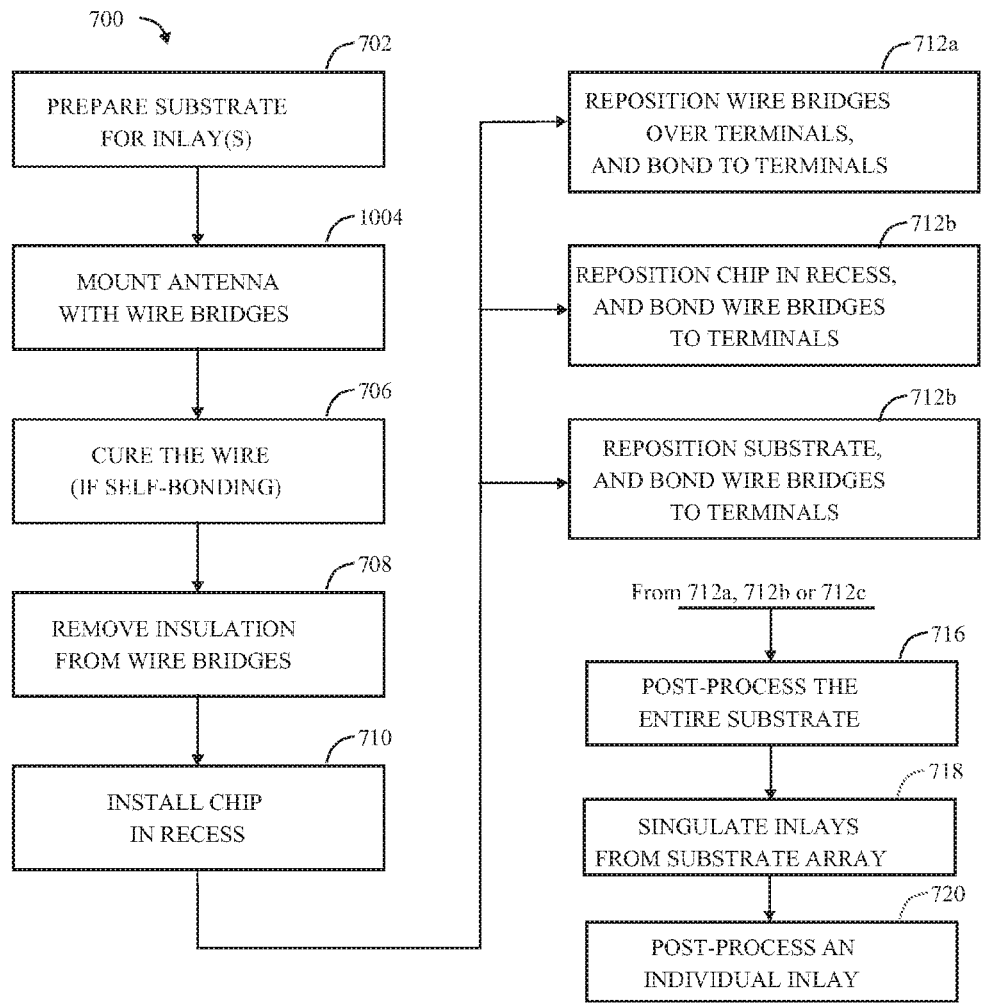

FIG. 7 is a diagram showing a manufacturing flow, according to an embodiment of the invention.

DETAILED DESCRIPTION OF THE INVENTION

Various "embodiments" of the invention will be discussed. An embodiment is an example or implementation of one or more aspects of the invention(s). Although various features of the invention may be described in the context of a single embodiment, the features may also be provided separately or in any suitable combination. Conversely, although the invention may be described herein in the context of separate embodiments for clarity, the invention may also be implemented in a single embodiment.

Some embodiments of the invention may relate to the "mounting" of, or apparatus for the "mounting" of, an antenna wire on inlay substrates (or sheets). As used herein, "mounting" includes embedding the antenna wire in (also called scribing) or adhesively placing the antenna wire on a surface of the substrate. (However, "embedding" should be interpreted to include "adhesively placing", if appropriate in the context of a given embodiment.) Ultimately, ends (or end portions) of the antenna may be connected to "bond pads" or "terminals" of the transponder chip (or chip module), such as by thermal (or thermo) compression bonding.

A conventional exemplary method to produce a transponder containing a high frequency RFID chip and an antenna embedded into a multi-layer substrate and connected to the terminal areas of the RFID chip, is to embed a wire conductor into a top substrate layer in the direction of the RFID chip residing in a recess and supported by a lower substrate layer, then to guide the wire conductor over the first terminal area of the RFID chip, then (after bridging the recess) continue the embedding process by countersinking the wire conductor into the top substrate layer to form an antenna with a specific number of turns, and then guiding the wire conductor over the second terminal area (again, bridging the recess), and finally embedding the wire conductor again into the top substrate layer before cutting the wire to complete the high frequency transponder site. Next, the wire ends passing over the terminals of the RFID chip are interconnected thereto, typically by thermal compression bonding. See, for example, the aforementioned U.S. Pat. No. 6,698,089, as well as FIGS. 1A and 1B described hereinabove.

Mounting an Antenna Wire to a Substrate

Generally, various apparatuses are known for embedding (or adhesively placing) the wire conductor into (or onto) a substrate that can operated either in the transverse axis or in the longitudinal axis. In the S10 provisional, various additional ultrasonic wire guide tools are disclosed for achieving this purpose.

The oscillation amplitude when operating in the horizontal (x or y) direction can be approximately 5 microns, whereby in the vertical (z) direction 22-25 microns is required to countersink the wire conductor into a substrate.

The operating frequency of the apparatus can be typically 60 KHz, but a frequency of 100 KHz or more can reduce the mechanical mass & dimensions of the ultrasonic wire guide tool and also enhance the performance.

The embedding of self bonding insulated wire into a synthetic substrate is performed using an ultrasonic horn and converter operating at a frequency between 35 and 60 kHz, and exerting a force of approximately 5 N (Newton) to sink the wire into the substrate. To embed onto a paper substrate, more pressure (approximately 15 to 20 N) is required to form an adhesive attachment between the self-bonding insulated wire and the paper substrate. Ultrasonic bonding is performed using a bond tool and transducer operating typically at a frequency of 60 kHz. The process uses a combination of vibration and force to effectively scrub the interface between the wire and the terminal area of the chip, causing a localized temperature rise, promoting the diffusion of molecules across the boundary.

It is generally sufficient, for purposes of this patent application, to take note of the fact that tools are known for mounting wires (such as a 60 micron wire) to a substrate, in a pattern (such as the antenna coil shown in FIG. 1B, and these tools can "manipulate" the wire, and where it is embedded, with a high degree of precision (such as a within 10 microns)—for example, the tool shown in U.S. Pat. No. 6,698,089.

Insulation Removal

Conventionally, an insulated wire conductor (such as 110) is bonded to the terminal (such as 108a or 108b) of a chip (such as 108) using thermal (or thermo) compression bonding. This is a welding process in which the insulated wire conductor is bonded to the terminal of a chip by passing a current through a thermode, which holds the wire conductor under force against the terminal area of the chip. Typically, the first impulse of current removes the insulation, while the second impulse results in the diffusion of the wire conductor with the terminal area of the chip. To obtain a reasonable deformation of the wire conductor during the bonding process, a force between 1.8 and 2.5 Newton is required. However, the insulation between the wire conductor and the terminal of the chip may not have fully evaporated during the thermal compression bonding process, resulting in an unreliable interconnection.

As discussed in the "S10" non-provisional, this quality issue may be resolved by removing the insulation before bonding, by passing the wire conductor through a laser tunnel, before the wire conductor is directed to the ultrasonic wire guide tool. The laser tunnel can be driven by glass fiber connected to a multiplexing diode laser. The inner wall of the tunnel can be coated with a reflective material. The position of the insulation removal can be defined and the length of wire conductor which passes from the laser tunnel to the ultrasonic wire guide tool can be measured. By using an un-insulated wire at the bond position the force required for the diffusion process can be reduced, and better controlled.

A 70 watt diode laser (808 nm) connected to a glass fiber (400 microns) can be used to remove a section of insulation layer (polyurethane) with a thickness of 2 to 4 microns from a moving wire conductor having a diameter of approximately 112 microns, by directing the laser beam to the side of the wire conductor under a gas atmospheric condition.

Alternatively, rather than removing insulation from the wire prior to mounting (such as with a laser tunnel associated with the wire guide tool), an insulated wire can be mounted to the substrate, and the insulation from end portions of the insulated wire bridging the recess can be removed with a separate laser system. In such a case, it may be convenient, but it is not necessary, that the recess extends all the way through the substrate. In any case, it is believed to be preferable that the insulation (which may be used to help adhere the wire to the substrate, and to prevent short-circuiting at cross-overs such as "c" in FIG. 1A) is removed at portions (segments) of the end portions of the wire which will be bonded to the terminals of the transponder chip.

When using a laser to remove insulation (non-conductive coating, typically enamel) from a wire conductor, in order to facilitate the interconnection of an insulated wire conductor to the terminal areas of an RFID chip, the enamel coating on the wire can be dyed with a dark color (such as black), to enhance absorption of the laser beam, hence heating (and evaporation) of the coating. A bare wire can also be blackened (the enamel is colored black) to increase the absorption of the laser beam, such as when performing interconnection of the wire to a terminal of a chip by laser welding. When using a laser to remove insulation, the wires can be attached to the terminals by conventional thermal compression bonding, or by laser welding, soldering, etc.

Oversize Recesses for the Transponder Chip

The "S11" provisional discloses various techniques for connecting end portions of an antenna wire embedded in a substrate to a transponder chip, which is disposed in a recess in the substrate. The chip may be a single integrated circuit (IC) chip, or a chip module including an IC chip. The transponder chip may be a high frequency RFID chip A conventional method to produce an inlay is to embed insulated wire into a synthetic material (or a coated substrate), form an antenna coil with a number of turns and interconnect the wire ends of the antenna to a transponder chip (or chip module). The interconnection of the antenna wire to the chip module is non-trivial, and it can be beneficial that the chip module can be installed on a substrate which has already been prepared with an antenna coil.

As exemplified by FIG. 1B, typically, before mounting (embedding or adhesively placing) the antenna 110 to the substrate 104, the transponder chip 108 is disposed in the recess 106. Then, the antenna is mounted with its end portions 110a, 110b spanning (bridging) the recess, directly above the terminals 108a, 108b of the transponder chip 108. Then, the end portions 110a, 110b of the antenna wire 110 are bonded to the terminals 108a, 108b of the transponder chip 108.

FIG. 1C shows the chip 108, having two terminals 108a and 108b is disposed in a recess 106 in a substrate (generally designated 104). The chip 108 may be rectangular, having a height dimension "h1" and a width dimension "w1". The chip 108 may measure 5.0 mm by 8.0 mm. The terminals 108a and 108b may be approximately 1.5 mm wide, and may be generally located just within the left and right (as viewed) side edges of the chip 108. The recess 106 may also be rectangular (having the same shape as the chip), and may be only slightly larger than the chip, such as 0.1 mm greater than the chip in both height and width. The recess 106 may measure 5.1 mm×8.1 mm. Generally, the recess 106 is large enough to receive the chip 108, and securely locate it, so that the chip 108 does not shift position after being disposed in the recess 106.

End portions 110a and 110b of the antenna wire 110 pass directly over respective terminals 108a and 108b on the chip 108, and are subsequently bonded thereto, as discussed above. The wire 110 may have a diameter of approximately 0.1 mm. The end portions 110a and 110b of the antenna wire 110 are spaced a distance "s1" apart from one another. The distance s1 is less than the chip width dimension w1, to ensure that the end portions 110a and 110b of the antenna wire 110 are positioned over the respective terminals 108a and 108b of the transponder chip 108.

The dashed lines extending from the top (as viewed) of the end portion 110a and the bottom (as viewed) of the end portion 110b indicate that the wire 110 continues, forming the antenna coil (see, for example, FIG. 1A). The round dots at the bottom (as viewed) of the end portion 110a and the top (as viewed) of the end portion 110b indicate that the wire ends (stops, does not continue).

A similar situation, wherein the end portions of the antenna wire spanning (or "bridging") the recess, directly above the chip terminals, is shown in FIGS. 4 and 5 of U.S. Pat. No. 6,698,089 ("089 patent"), incorporated by reference in its entirety herein.

A problem with the technique of mounting the end portions of the antenna wire so that they bridge (span across) the recess for the chip is that the if the chip is installed (in the recess) from the front (antenna) side of the substrate it must be installed before the antenna is mounted (consequently, the antenna must be mounted with the chip in place). Else, if it is desired to install the chip after the antenna is mounted, the recess must extend all the way through the substrate (as a "window") and the chip must be installed from the opposite side of the substrate.

It is further discussed in the 089 patent that that a single ultrasonic instrument can be used both for fixation of the wire (mounting the wire on the substrate), and for connection of (bonding) the wire to the terminals of the chip. (column 15, lines 33-36)

The process described above with reference to FIGS. 14 and 15 of the 089 patent also offers the possibility, by appropriate choice of the points of fixation of the wire conductor on the substrate, of guiding the wire conductor away diagonally via the terminal areas, in order to increase the overlap between the wire conductor and the terminal areas. Also, several chips or other elements arranged in series on, or in, a substrate can be connected by means of the wire conductor in the manner represented in FIG. 14. (column 14, lines 39-47)

FIGS. 16 and 17 of the 089 patent show that a chip (132) may be introduced into the recess (114) after fixation of the wire conductor (113) on the surface of the substrate. Ends of the wire pass over the recess, generally in alignment with positions corresponding to terminals on the chip. After the chip is installed (FIG. 16), a connecting instrument enables a connection of the wire conductor to the corresponding terminal area. Also, as discussed in the 089 patent, in order to enable a positioning of the chip that is suitable for contacting of the wire conductor, the chip (132) is equipped on its contact side with a bridge-tape alignment aids (135), arranged adjacent to a terminal area, which provide for correct relative positioning via guide bevels (136).

Re-Positioning the Wires (FIGS. 2A, 2B)

FIGS. 2A and 2B illustrate an embodiment of the invention which utilizes a "wire bridge" method, and in which a chip (or chip module) and the antenna are positioned on a common substrate, whereby the antenna resides on the top side (front surface) of the substrate and the chip may be inserted from either the top side or the bottom (opposite) side.

The substrate has a rectangular recess or cavity to accommodate a rectangular chip module and the end portions of the antenna wire, which pass over (span, bridge) the cavity. The antenna is mounted to the front (top) side (surface) of the substrate, and the chip can be inserted into a recess extending only partway through the substrate from the front surface thereof, after the antenna is mounted to the front surface of the substrate. Or, the chip can be inserted in to a cavity extending all the way through the substrate, from the opposite back (bottom) side (surface) of the substrate.

In this embodiment, rather than the end portions of the wire passing directly over the terminals of the transponder chip, the end portions of the antenna wire are located adjacent to (next to, rather than directly over) the terminal areas of the chip, and thus form a wire bridge on each side of the chip. The chip module may be positioned in the cavity with the end portions of the antenna wire already stretching over (passing over, spanning, bridging) the cavity (or recess) and mounted to (embedded in or adhesively placed onto) the surface of the substrate.

Generally, as used herein describing embodiments of the invention, the "transponder chip" is an electronic component comprising (having at least) two terminals, which may be a single chip, or a module comprising (having at least) a chip. Generally, the two terminals of the chip or module are interconnected with corresponding two end portions of the antenna wire which is mounted to a top surface of a substrate, which may be a multilayer substrate.

Generally, as used herein describing embodiments of the invention, the transponder chip is disposed in a "recess" or "cavity" which is an opening extending at least partially through the substrate. A "window" is generally an opening that may extend fully through the substrate. A "slot" is another opening (or hole) extending through the substrate next to a recess, cavity or window. In some embodiments, any of recess, cavity, window, or slot (and combinations thereof) may be used, and when the term "recess" is used, it should be understood to include all the variations and combinations, as may be appropriate from the context.

As used herein, a "recess" is generally (and usually) an opening extending only partially through a (typically) multilayer substrate (the recess may extend completely through top layers only), as may be exemplified by the recess 106 (FIG. 1B). The term "cavity" may be used interchangeably with "recess". A "window" is generally (and usually) an opening extending completely through a substrate (whether or not multilayer), as may be exemplified by the opening 56 in FIG. 6 of U.S. Pat. No. 6,698,089.

FIGS. 2A and 2B correspond with FIGS. 3A and 3B of the "S11" provisional and illustrate a transponder site 202 (compare 102) on a substrate 204 (compare 104) which may be a portion of an overall inlay sheet 200 (compare 100), whereby an "oversized" recess 206 (compare 106) is provided for a transponder chip 208 (compare 108). The transponder chip 208 may be disposed in the recess 206 after the antenna 210 (compare 110) is mounted (embedded in or adhesively place on) the substrate 204.

The chip 208, has two terminals 208a and 208b, and may be rectangular, having a height dimension "h3" and a width dimension "w3". The chip 208 may measure 5.0 mm by 8.0 mm (the chip 208 may have the same dimensions as the chip 108).

The recess 206 is also rectangular (generally, the same shape as the chip), having a height dimension "h4" and a width dimension "w4". The height dimension h3 of the recess may be only slightly larger, such as 0.1 mm greater, than the height dimension h2 of the chip. This is generally the same as the situation illustrated in FIG. 1C.

The width dimension w4 of the recess 206 is larger, such as 2 mm-3 mm greater, than the width dimension w3 of the chip 208. For example, given a chip having a width dimension of 5 mm-8 mm, the width dimension w4 of the recess may be 25% (2 mm/8 mm) to 60% (3 mm/5 mm) greater than the width dimension w2

The FIG. 1C prior art recess 106 is only slightly (such as up to 2%) larger than the chip 108, in both its width and height dimensions. The "oversize" recess 206 of this embodiment may be only slightly larger than the chip in the height dimension (h4 slightly greater than h3), but the recess 206 is more than slightly larger than the chip 208, in the width dimension, such as at least 5% larger, at least 10% larger, at least 20% larger, at least 25% larger, at least 30% larger, at least 35% larger, at least 40% larger, at least 45% larger, at least 50% larger, at least 55% larger, at least 60% larger. It is within the scope of the invention that the recess (206), and other "oversize" recesses described herein, is also more than slightly larger than the chip (208) in the height dimension.

End portions 210a and 210b of the antenna wire 210 do not pass directly over respective terminals 208a and 208b of the chip 208. (The end portions 210a and 210b of the antenna wire 210 do not pass over an area which will be occupied by the chip 208.) Rather, the two end portions 210a and 210b of the antenna wire span (bridge) the recess 206, and are spaced apart from one another a distance (s2) which is greater than the width (w3) of the chip 208, so that the chip 208 can be inserted into the recess 206 from the same side of the substrate 204 as the antenna, past the end portions of the wires, after the antenna has been mounted (embedded in or adhesively placed on) to the substrate 204. Subsequently, as described in greater detail hereinbelow, the end portions 210 and 210b of the wire 210 are manipulated (re-positioned, moved, stretched) so as to be over the terminals 208a and 208b, and are bonded thereto.

The dashed lines extending from the top (as viewed) of the end portion 210a and the bottom (as viewed) of the end portion 210b indicate that the wire continues, forming the antenna coil (see FIG. 1A). The dots at the bottom (as viewed) of the end portion 210a and the top (as viewed) of the end portion 210b indicate that the wire ends (stops, does not continue).

In this embodiment, slots 207a and 207b are provided on the left and right (as viewed) side edges of the recess 206. The slots 207a and 207b may extend fully through the substrate 204, while the recess 206 may extend only partially through the substrate 204.

From one point of view, the slots 207a and 207b are simply lateral extensions of the recess 206 and, as such, may be considered simply to be side edge portions of the recess 206. In this aspect, the slots 207a and 207b extending from the side edges of the recess 206 could be the full height dimension of the recess, rather than being shorter, as illustrated.

The slots 207a and 207b (whether or not considered to be a part of the recess, per se) provide an area under the wire which is deeper than the recess 206, such as fully through the substrate, to allow a hook or wire gripper to pass easily under the wires. The chip resides in the recess, but the slots 207a and 207b provide "windows" under the "wire bridges" which allows the end portions of the wire to be gripped more easily for positioning purposes, either from the top or bottom of the substrate, or both.

Some advantages to having the slots 207a and 207b include that they can provide an opportunity to install an optical mechanism in conjunction with a UV laser for insulation removal (removing coating from the wire bridges, prior to bonding). In use, one would have an insulation removal station in the transponder line and the laser can remove the insulation from all sides of the wire without restrictions. It also avoids any damaging or markings to the substrate. A mirrored surface under the slots can also be used, in conjunction with a vision system, to ensure that the insulation is completely removed. Also, during the bonding process, slots under the positioned chip and wire can be advantageous as one can support the chip with a well-defined surface during bonding.

As illustrated in FIG. 2A, prior to placing (locating, disposing) the chip 208 in the recess 206, an antenna is formed by passing a wire conductor 210 over the slotted cavity area 207a, forming an antenna, and finally passing the wire conductor over the second slotted cavity 207b, The wire conductor on each side of the chip cavity or chip recess forms wire bridges. The wire bridges are mounted into or onto the substrate, and therefore are in a fixed position.

Generally, in any of the embodiments described herein, it is also possible to remove the insulation before proceeding to the next step in the process, such as prior to bonding the end portions of the antenna wire (wire bridges) to the terminals of the transponder chip (or chip module).

FIG. 2B illustrates the placement of a chip 208 into the recess 206, and the subsequent re-positioning of the wire bridges 210a and 210b over the terminal areas 208a and 208b of the chip 208 for subsequent bonding thereto (bonding is not shown, it is known, see bond head 118, FIG. 1).

If the recess 206 extends only partially through the substrate 204 (compare recess 106, FIG. 1), the chip 208 can be placed in the cavity, after the antenna is mounted, with the wire bridges in place, since the wire bridges are spaced apart from one another wider than the width dimension w3 of the chip 208. Alternatively, the recess (or cavity) 206 can extend completely through the substrate 204, in which case the chip could be inserted from the bottom of the recess (or window).

Note that the wires are spaced farther apart than width of chip (which means that the chip can be inserted from the top side), then (after chip is in place) the wires are re-positioned inward to be over the terminals. The wire bridges may be moved into position with a wire gripper tool (not shown).

After the end portions 210a and 210b of the antenna wire 210 are moved into position over the respective terminals 208a and 208b of the transponder chip 208, they are spaced a distance "s3" apart, which corresponds to the distance between the two terminals 208a and 208b (compare wire spacing "s1" in FIG. 1C).

This method of re-positioning the wire conductor requires a tool (not shown) to form or grip the wires and re-position them above the terminals of the transponder chip, in preparation for interconnection (bonding) with the terminals of the transponder chip. Such a tool is well known, and is referred to in the industry as a "wire gripper". The tool can be in the form of an elongate member terminating in a hook, like a crochet needle, having a diameter approximately equal to the diameter of the wire being gripped (and moved). See, for example, FIG. 6B. In use, two of these hooks, positioned generally parallel with one another and spaced approximately one wire diameter apart, can be used to pull on the wire from two points, rather than one. In FIG. 2B, the re-positioned wire is shown semicircular. It should be understood that if one hook were used to pull on a wire, the repositioned wire would look more triangular (with an apex), and if two closely-spaced hooks were used to reposition the wire, it would look like a triangle with a flat apex (a trapezoid).

In use, a transponder site commences with the wire conductor being mounted into or onto the substrate over a short distance, then drawing the wire conductor over a cavity (or recess) to accommodate the chip as well as the wire bridges and mounting the wire conductor into or onto the substrate in forming an antenna, then drawing the wire conductor over the cavity on the opposite side to create a second wire bridge and finally mounting the wire conductor into or onto the substrate over a short distance before cutting the wire.

In a next step of the process, the insulation of the wire conductor may be removed in preparation for interconnection. The wire is formed so that a loop will extend over the terminal areas of the chip. The forming of the wire can also be before insulation removal.

The chip may be positioned (installed, located, disposed) in the cavity from above or from below (if the recess extends fully through the substrate) using a vacuum suction system to keep the chip in place. And finally, the end portions of the antenna wire are connected to the terminals of the chip.

An advantage to various embodiments of the invention disclosed herein, particularly those that involve mounting the antenna wire before installing the transponder chip, is that this facilitates removal of insulation (coating) from the antenna wire at the end portions of the wire (wire bridges) where bonding to the terminals of the transponder chip (or chip module) will occur. Various problems which may thus be avoided or minimized may include damaging the chip, unwanted reflections from the chip, accessibility to perform the insulation removal process, inspectability of the insulation removal process, etc.

Moving the Chip (FIGS. 3A-3E)

In the previously described embodiment, the end portions of the antenna wire are initially placed on the substrate wider apart than the chip, spanning a recess (or slots on side edges of the recess), and the end portions of the wire are subsequently repositioned to be over the terminals of the chip, for bonding thereto. Insulation may be removed from the end portions of the wire spanning the recess (or slots) prior to mounting the chip in the recess.

This embodiment of the invention involves providing an enlarged (oversized) recess (cavity, window) to accept the chip, and creating "wire bridges" spanning the oversized cavity, the wires being spaced sufficiently apart that a chip may be installed between the wires, into the recess. The substrate may be a multi-layer substrate.

Generally, the two wire bridges (end portions of the antenna wire spanning the recess) are spaced farther apart than the width of the chip, so that the chip can be inserted into the recess from the same (top) side of the substrate, past the two wire end portions of the antenna which are bridging (extending across) the recess, after then antenna has been mounted to the substrate.

The recess is significantly larger (in width) than the chip, so that the chip can be repositioned (moved) side-to-side within the recess. In a first repositioning step, the chip is repositioned so that a first terminal of the chip is disposed under a corresponding first end portion of the antenna which is bridging the recess, and the end portion of the antenna wire is bonded thereto. In a second repositioning step, the chip is repositioned so that a second terminal of the chip is disposed under a corresponding second end portion of the antenna wire which is bridging the recess, and the end portion of the antenna is bonded thereto. (Since the chip has already been bonded to the first end of the antenna, some slack should be left in the first end of the antenna when forming the bridge so that it does not impair the sideways movement of the chip to the second position.) In these repositioning steps, the chip may by moved sideways with a suitable chip manipulating tool, such as a pipette, not shown.

For example a chip having a width of 4 mm (4000 μm) can be placed in a recess having a width of 6 mm (6000 μm), so that the chip can be moved 1 mm in either direction. The terminals of the chip may be 0.5 mm (500 μm) inward from a side edge of the chip, and thus spaced 3 mm apart from one another. The two wire ends, bridging the recess generally parallel with one another, may spaced 5 mm from one another, which permits the chip (4 mm width) to be inserted therebetween.

After the first bond, the chip may be moved 2 mm (2000 μm) so that the second terminal is under the second end of the wire, for bonding thereto. Slack can be created in the wire, to facilitate movement of the chip, by forming embedding or partially-embedded squiggles (by reduced force of the sonotrode embedding the wire) the wire into the substrate with "squiggles" at the ends of the bridges (the four bridge starting/ending points) so that as the wire rips out, there is some slack to accommodate movement of the chip.

According to a feature of the invention, after forming the antenna having end portions passing over (bridging) the recess, insulation may be removed from the wire in preparation for bonding to the terminals of the chip, prior to installing the chip in the recess. Insulation removal may be done with a laser, not shown.

FIGS. 3A-3E correspond with FIGS. 4A-4E of the "S11" provisional and illustrate a transponder site 302 (compare 102, 202) on a substrate 304 (compare 104) which may be a portion of an overall inlay sheet 300 (compare 100), whereby an oversized recess 306 (compare 106, 206) is provided for a transponder chip 308 (compare 108, 208). The transponder chip 308 may be disposed in the recess 306 after the antenna 310 (compare 110, 210) is mounted (embedded in or adhesively place on) the substrate.

The chip 308, has two terminals 308a and 308b, and may be rectangular, having a height dimension "h5" and a width dimension "w5". The chip 308 may be a chip module measuring measure h5=4.0 mm by w5=6.0 mm.

The recess 306 is also rectangular (generally, the same shape as the chip), having a height dimension "h6" and a width dimension "w6". The height dimension h6 of the recess may be only slightly larger, such as 0.1 mm greater, than the height dimension h5 of the chip. This (the height of the recess only slightly larger than the height of the chip) is generally the same as the situation illustrated in FIG. 1C.

The width dimension w6 of the recess 306 is substantially (much) larger, such as 3 mm-4 mm greater, than the width dimension w5 of the chip 308. For example, given a chip 308 measuring h5=4 mm and w5=6 mm, the recess 306 may have dimensions of h6=4.1 mm and w6=10 mm. In other words, the width dimension w6 of the recess 306 is significantly greater than the width dimension w5 of the chip 308, such as 40% greater, including at least 20% greater, at least 25% greater, at least 30% greater, at least 40% greater, at least 50% greater, at least 60% greater.

As in the previous embodiment (FIGS. 2A-2B), end portions 310a and 310b of the antenna wire 310 do not pass directly over respective terminals 308a and 308b of the chip 308. Rather, the two end portions 310a and 310b of the antenna wire, which may be referred to as "wire bridges", span (bridge, pass over) the recess 306, and are spaced apart from one another a distance (s4) which is greater than the width (w5) of the chip 308, so that the chip 308 can be inserted into the recess 306 from the same side of the substrate as the antenna, past the end portions of the wires, after the antenna has been mounted (embedded in or adhesively placed on) to the substrate. Subsequently, as described in greater detail hereinbelow, the chip 308 is moved (re-positioned, manipulated) so that its terminals 308a and 308b are under respective ones of the end portions 310a and 310b of the antenna wire 310, for bonding thereto.

The dashed lines extending from the top (as viewed) of the end portion 310a and the bottom (as viewed) of the end portion 310b indicate that the wire continues, forming the antenna coil (see FIG. 1A). The dots at the bottom (as viewed) of the end portion 310a and the top (as viewed) of the end portion 310b indicate that the wire ends (stops, does not continue).

FIG. 3A shows the enlarged cavity 306 in a substrate. The cavity 306 may measure w6=10 mm and h6=5 mm. The figure shows end portions 310a and 310b of the antenna wire 310 bridging (spanning) the cavity 306 near the outer edges thereof. The end portions 310a and 310b of the antenna wire 310 may be spaced (for example) 0.5 mm inward from the respective left and right side edges of the cavity 306, in which case the distance s4 between the two wire bridges would be 8 mm (10 mm−1 mm−1 mm).

The insulation or coating (if any) on the end portions 310a and 310b of the antenna wire 310 may be removed at this stage, such as with a laser (not shown).

FIG. 3B shows a chip module 308 inserted into the cavity 306. This chip module 308 may measure w5=6 mm by h5=4 mm. Since w5 (6 mm, in this example) is less than s4 (8 mm, in this example), the chip module 308 fits easily between the end portions 310a and 310b of the antenna wire 310. The chip module 308 is shown centered in the cavity 306.

In FIG. 3C, the chip is moved, such as 1.0 mm, as indicated by the arrow 320, to one side of the cavity 306 so that a first terminal 308a is positioned under a first one 310a of the end portions (wire bridges) of the wire 310, and the end portion 310a of the wire 310 is bonded to the terminal 308a using any suitable conventional means for bonding (not shown in this figure, see 118 in FIG. 1B). This movement of the chip imparts a relative motion between the chip and the substrate, hence between the chip and the end portions of the wire mounted to the substrate.

In FIG. 3D, the chip is moved, such as 2.0 mm (1.0 mm to its original position, then 1.0 mm further), as indicated by the arrow 322, to the other side of the cavity 306 so that a second terminal 308b is positioned under a second one 310b of the end portions (wire bridges) of the wire 310, and the end portion 310b of the wire 310 is bonded to the terminal 308b using any suitable conventional means for bonding (not shown in this figure, see 118 in FIG. 1B). This movement of the chip imparts a relative motion between the chip and the substrate, hence between the chip and the end portions of the wire mounted to the substrate.

As shown in FIG. 3D, this movement of the chip module 308 "drags" (deforms, stretches) the first one 310a' (prime) of the end portions (wire bridges) of the wire 310. The wire itself can typically stretch a little. Some slack can be left in the wire. Immediately before bridging the cavity, the wire can be lightly embedded in a curve pattern, such as squiggles, so that it can "play out" (become un-embedded, locally) and "follow" the chip module 308 as the chip module 308 is repositioned. The process can be terminated here, with the chip module 308 being located of center within the cavity 306.

FIG. 3E illustrates that the chip module 308 may be moved, such as 1.0 mm, as indicated by the arrow 324, back to a center position within the cavity 306 and, as shown in this figure, this movement of the chip module 308 "drags" (deforms, stretches) the second one 310b' (prime) of the end portions (wire bridges) of the wire 310 along with it. The first one 310a of the end portions (wire bridges) of the wire 310 may become somewhat "bunched up" by this movement. This movement of the chip imparts a relative motion between the chip and the substrate, hence between the chip and the end portions of the wire mounted to the substrate.

Whereas, initially, as shown in FIG. 3A, the end portions 310a/310b of the wire 310 are spaced a distance s4 apart from one another which is wider than the width dimension w5 of the chip 308 (s4>w5), it can be seen in FIG. 3E (also FIG. 3D) that the end portions 310a'/310b' of the wire 310 have been deformed, so as to be finally closer with one another, spaced a distance s5 apart from one another which is less than the initial spacing s4 (s5<s4). The distance s5 between "bonding portions" of the end portions 310a'/310b' of the wire 310 is slightly less than the width w5 of the chip 308 so that the bonding portions of the wire which are to be interconnected (bonded) to the terminals of the chip are spaced apart approximately equal to the spacing (not labeled) between the terminals 308a/308b of the chip.

In use, a transponder site commences with the wire conductor being mounted into or onto the substrate over a short distance, then drawing the wire conductor over the enlarged cavity to accommodate the chip as well as the wire bridges, mounting the wire conductor into or onto the substrate in forming an antenna, then drawing the wire conductor over the cavity on the opposite side to create a second wire bridge and finally mounting the wire conductor into or onto the substrate over a short distance before cutting the wire.

In the next step of the process, the insulation of the wire conductor may be removed in preparation for interconnection.

The chip 308 may be positioned into the enlarged cavity 306 from above using a conventional pick & place system (not shown). The chip can shift (slide) from right to left (side-to-side), horizontally in the cavity (until it reaches the side edges of the cavity), while its movement is restricted in the vertical direction by the top and bottom (as viewed) side edges of the cavity 306.

A conventional suction pipette (not shown) may be used to align the chip under the first wire bridge and the wire conductor is bonded to the first terminal area on the chip. Then the chip is aligned to the second wire bridge and the wire conductor is bonded to the second terminal area on the chip.

To protect the bond areas an epoxy (not shown) can be dispensed. In addition, a flexible adhesive (not shown) can be dispensed in the chip cavity before placing the chip.

Moving the Substrate (FIGS. 4A-4E)

Generally, as described above, in a transponder the two end portions of the antenna need to be interconnected (such as by bonding) to two corresponding terminals of the chip (or chip module).

In the prior art described with respect to FIG. 1C, the recess has a width (w2) which is only slightly (such as 2%) larger (50 to 100 microns) than the width (w1) of the chip. The two end portions of the antenna wire span (bridge) the recess, and are spaced apart from one another a distance (s1) which is less than the width (w1) of the chip, and which is substantially equal to the spacing of the terminals of the chip. Generally speaking, because the wires (wire bridges) are "in the way", the chip cannot be inserted into the recess from the same side of the substrate as the antenna, past the end portions of the wires, and is therefore generally disposed in the recess prior to the antenna being mounted to the substrate. (Or, the chip must be inserted from the opposite side of the substrate.) The antenna is mounted with the end portions of the wires passing directly over the chip terminals, and are bonded thereto.

In the embodiment of the invention described with respect to FIGS. 2A-2B, the recess (including the slots) has a width (w4) which is more than slightly greater than the width (w3) of the chip. The two end portions of the antenna wire span (bridge) the recess, and are spaced apart from one another a distance (s2) which is greater than the width (w3) of the chip, so that the chip can be inserted into the recess from the same side of the substrate as the antenna, past the end portions of the wires. Subsequently, the end portions of the wires are manipulated (re-positioned) so as to be over the terminals, and are bonded thereto. In simple terms, the wire is mounted, the wire bridges are initially spaced wide apart, the chip is inserted, and the wire bridges are "directly" manipulated to be closer together for bonding to the terminals of the chip.

In the embodiment of the invention described with respect to FIGS. 3A-3E, the recess has a width (w6) which is substantially greater than the width (w5) of the chip. The two end portions of the antenna wire span (bridge) the recess, and are spaced apart from one another a distance (s4) which is greater than the width (w5) of the chip, so that the chip can be inserted into the recess from the same side of the substrate as the antenna, past the end portions of the wires. Subsequently, the chip is moved, from side-to-side, so that in a given position, each of the terminals is under a corresponding one of the end portions of the wires, and the end portions of the wire are bonded to the terminals. In simple terms, the wire is mounted, the wire bridges are initially spaced wide apart, the chip is inserted and is sequentially moved to bring its terminals into position under the wire bridges for bonding thereto, a result of which is, as in the FIGS. 2A-2B embodiment, the wire bridges are "indirectly" caused to be closer together for bonding to the terminals of the chip.

Generally, the movement of the chip module 308 within the recess 306 may be considered to be a "relative motion" between the chip module 308 and the substrate, wherein either one of (or both of) the chip module and or the substrate can be moved, relative to the other, to position the terminals of the chip module under the corresponding end portions of the antenna wire, for bonding thereto. As described in greater detail hereinbelow, in simple terms, the wire is mounted, the wire bridges are initially spaced wide apart, the chip is inserted and is the substrate is sequentially moved to bring the chip's terminals into position under the wire bridges for bonding thereto, a result of which is, as in the FIGS. 2A-2B embodiment, the wire bridges are brought closer together for bonding to the terminals of the chip.

In the embodiment of the invention now described with respect to FIGS. 4A-4E, rather than moving the chip module while the substrate remains fixed, the substrate is moved while the chip module remains fixed. Since the situation is one of relative motion, no additional figures are required. However, to add clarity, FIGS. 4A-4E are cross-sections, rather than top views.

Generally, FIGS. 4A-4E correspond with FIGS. 3A-3E, but the height dimensions (h5 and h6) will not be visible in these cross-sectional views.

Generally, in FIGS. 4A-4E, a selected one of the transponder areas 402 (compare 102) constituting a single transponder is shown in detail. As was the case described hereinabove with respect to FIG. 1A, there may be additional transponder areas (and corresponding additional transponders) disposed to the left and right of, as well as above and below, the transponder 102, on an inlay sheet. Such a plurality of transponders may be arranged in an array on the (larger) inlay sheet.

The inlay sheet 400 (compare 100) may be a multi-layer substrate. As illustrated in FIGS. 4A-4E, the inlay sheet 400 may comprise one or more upper (top) layers 404a and one or more lower (bottom) layers 404b.

A recess 406 (compare 106, 306) may be formed in the upper layer 404a, at a "transponder chip site", so that a transponder chip 408 (compare 108, 308) may be disposed in the recess, and supported by the lower layer 404b. The transponder chip 408 is shown having two terminals 408a and 408b on a top surface thereof. As is the case in all of the embodiments described herein, the transponder chip may be a single chip or a chip module.

FIGS. 4A-4E illustrate a transponder site 402 (compare 302) on a substrate 400 (compare 100), whereby an oversized recess 406 (compare 306) is provided for a transponder chip 408 (compare 308). The transponder chip 408 may be disposed in the recess 406 after the antenna 410 (compare 310) is mounted (embedded in or adhesively place on) the substrate 400.

The chip 408, has two terminals 408a and 408b, and may be rectangular, having a height dimension "h7" (not visible in this view, but may be the same as h5) and a width dimension "w7" (which may be the same as w5). The chip 408 may be a chip module measuring measure h5=4.0 mm by w7=6.0 mm.

The recess 406 is also rectangular (generally, the same shape as the chip), having a height dimension "h8" (not visible in this view, but may be the same as h6) and a width dimension "w8" (which may be the same as w6).

The height dimension h6 of the recess may be only slightly larger, such as 0.1 mm greater, than the height dimension h5 of the chip. (This is similar to what was discussed with respect to the FIGS. 3A-3B embodiment, as well as the FIGS. 2A-2B embodiment.)

The width dimension w8 of the recess 406 is much larger, such as 3 mm-4 mm greater, than the width dimension w7 of the chip 408. For example, given a chip 408 measuring h7=4 mm and w7=6 mm, the recess 406 may have dimensions of h8=5 mm and w8=10 mm. In other words, the width dimension of the recess 406 is significantly greater than the width dimension of the chip 408, such as 40% greater, including at least 20% greater, at least 25% greater, at least 30% greater, at least 40% greater, at least 50% greater, at least 60% greater.

As in the previous embodiment (FIGS. 3A-3E), end portions 410a and 410b of the antenna wire 410 do not pass directly over respective terminals 408a and 408b of the chip 408. Rather, the two end portions 410a and 410b of the antenna wire span (bridge) the recess 406, and are spaced apart from one another a distance (s6) which is greater than the width (w7) of the chip 408, so that the chip 408 can be inserted into the recess 406 from the same side of the substrate as the antenna, past the end portions of the wires, after the antenna has been mounted (embedded in or adhesively placed on) to the substrate. Subsequently, as described in greater detail hereinbelow, the substrate 402 is moved (re-positioned, manipulated) so that its terminals 408a and 408b are under respective ones of the end portions 410a and 410b of the antenna wire 410, for bonding thereto.

Figure 4A:
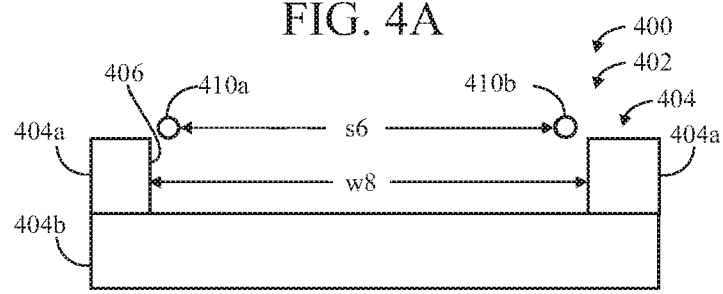

FIG. 4A shows the enlarged cavity 406 in a substrate 402. The cavity 406 may measure w8=10 mm. The figure shows end portions 410a and 410b of the antenna wire 410 bridging (spanning) the cavity 406 near the outer edges thereof. The end portions 410a and 410b of the antenna wire 410 may be spaced (for example) 0.5 mm inward from the respective left and right side edges of the cavity 406, in which case the distance s6 between the two wire bridges would be 8 mm (10 mm−1 mm−1 mm=8 mm).

The insulation or coating (if any) on the end portions 410a and 410b of the antenna wire 410 may be removed at this stage, such as with a laser (not shown).

Figure 4B:
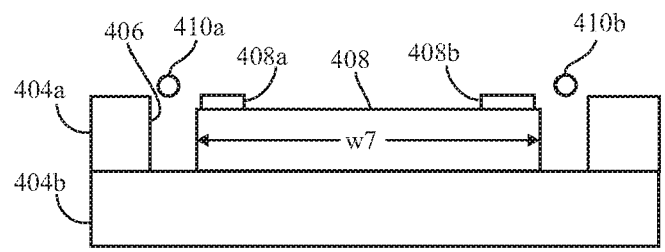

FIG. 4B shows a chip module 408 inserted into the cavity 406. This chip module 408 may measure w7=6 mm. Since w7 (6 mm, in this example) is less than s6 (8 mm, in this example), the chip module 408 fits easily between the end portions 410a and 410b of the antenna wire 410. The chip module 408 is shown centered in the cavity 406.

Figure 4C:
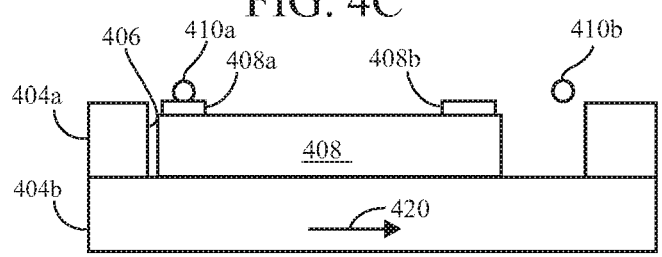

In FIG. 4C, the substrate 402 is moved, such as 1.0 mm, as indicated by the arrow 420, so that the chip 408 is positioned to one side of the cavity 406, so that a first terminal 408a is positioned under a first one 410a of the end portions (wire bridges) of the wire 410, and the end portion 410a of the wire 410 is bonded to the terminal 408a using any suitable conventional means for bonding (not shown in this figure, see 118 in FIG. 1B). This movement of the substrate imparts a relative motion between the chip and the substrate, as described hereinabove.

Figure 4D:
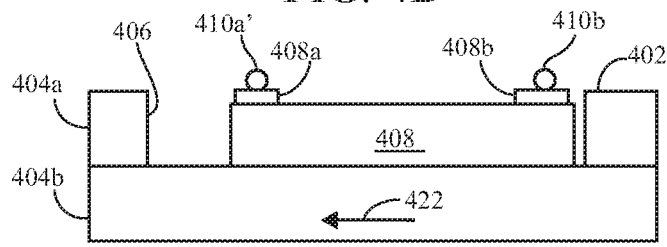

In FIG. 4D, the substrate 402 is moved, such as 2.0 mm (1.0 mm to its original position, then 1.0 mm further), as indicated by the arrow 422, so that the chip 408 is positioned to the other side of the cavity 406, so that a second terminal 408b is positioned under a second one 410b of the end portions (wire bridges) of the wire 410, and the end portion 410b of the wire 410 is bonded to the terminal 408b using any suitable conventional means for bonding (not shown in this figure, see 118 in FIG. 1B). This movement of the substrate imparts a relative motion between the chip and the substrate, as described hereinabove.

As mentioned hereinabove, and as shown in FIG. 3D, this relative movement of the substrate and the chip module will "drag" (deform, stretch) the first one 410a' (prime) of the end portions (wire bridges) of the wire 410.

Figure 4E:
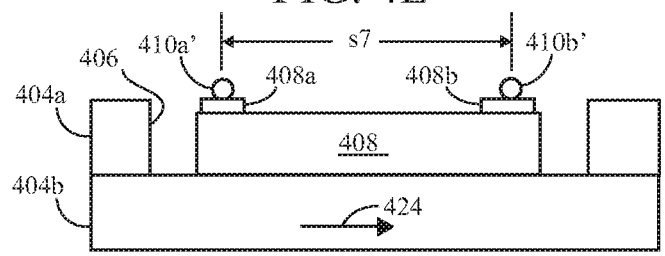

FIG. 4E illustrates that the substrate 402 may be moved, such as 1.0 mm, as indicated by the arrow 324, back to its original position, with the chip module 408 centered within the cavity 406, which will drag the second one 410b' (prime) of the end portions (wire bridges) of the wire 410 along with it, as discussed hereinabove with respect to FIG. 3E. This movement of the substrate imparts a relative motion between the chip and the substrate, as described hereinabove.

Whereas, initially, as shown in FIG. 4A, the end portions 410a/410b of the wire 410 are spaced a distance s6 apart from one another which is wider than the width dimension w7 of the chip 408 (s6>w7), it can be seen in FIG. 4E (also FIG. 4D) that the end portions 410a/410b of the wire 410 have been deformed, so as to be finally closer with one another, spaced a distance s7 apart from one another which is less than the initial spacing s7 (s7<s6). The distance s7 between "bonding portions" of the end portions 410a/410b of the wire 410 is slightly less than the width w7 of the chip 408 so that the bonding portions of the wire which are to be interconnected (bonded) to the terminals of the chip are spaced apart approximately equal to the spacing (not labeled) between the terminals 408a/408b of the chip.

It may be noted, looking at FIGS. 4B-4E, that the chip module 408 is always in the same position (horizontally) on the sheet, and the substrate 402 is in different horizontal positions—centered in FIG. 4B, positioned to the right in FIG. 4C, positioned to the left of center in FIG. 4D, and centered (re-centered) in FIG. 4E. This is in contrast with what is shown in FIGS. 3B-3E, where the substrate (as represented by the recess 306) is always in the same position (albeit in different positions on the sheet), and it is the chip that moves within the recess—centered in FIG. 3B, positioned to the left in FIG. 3C, positioned to the right of center in FIG. 3D, and re-centered in FIG. 3E.

In use, a transponder site commences with the wire conductor being mounted into or onto the substrate over a short distance, then drawing the wire conductor over the enlarged cavity to accommodate the chip as well as the wire bridges, mounting the wire conductor into or onto the substrate in forming an antenna, then drawing the wire conductor over the cavity on the opposite side to create a second wire bridge and finally mounting the wire conductor into or onto the substrate over a short distance before cutting the wire.

In the next step of the process, the insulation of the wire conductor may be removed in preparation for interconnection.

The chip is positioned into the enlarged cavity from above using a conventional pick & place system (not shown). The substrate can shift from right to left (side-to-side), so that the chip is in different positions in the cavity.

A suction pipette (not shown) may be used to insert the chip into the recess and to hold the chip in a fixed position while the substrate is moving, to position the terminals under corresponding end portions (bridges) of the antenna wire, as described above.

If the recess extends all the way through the substrate, the chip can be inserted and maintained in its "fixed" position from below.

A recess extending all the way through the substrate (which may be referred to as a "window") may be advantageous in that it allows the chip to reside on a hard (such as ceramic), pre-heated (such as to 100 degrees-C.) work surface during bonding, which can improve thermode ageing problems. Also, for mounting (such as embedding) the wire, having the substrate on a hard surface may be advantageous. A window also allows for the use of a UV laser and optics, from either above or below, for removal of insulation from the wire.

Ceramic insert(s) may be included in the work plate. The chip may be held under vacuum to the work surface, and under the terminal areas of the chip there are ceramic plates to enhance the bonding process. In the case of a die, the entire chip may sit on a ceramic plate. The ceramic plate can he heated.

To protect the bond areas an epoxy (not shown) can be dispensed. In addition, a flexible adhesive (not shown) can be dispensed in the chip cavity before placing the chip.

Generally, it can be seen that the recesses 206, 306, 406 are sufficiently larger than the chip 208, 308, 408 so that the end portions of the wires can be spaced farther apart than the width of the chip. After installing the chip in the recess, the wires are brought closer together (by moving at least one of the wires, either "directly" or "indirectly") so that they are both disposed over corresponding terminals of the chip, for bonding thereto.

In the FIGS. 2A-2B embodiment, the chip and the substrate remain stationary, and the end portions of the wires are (directly) moved, closer together, to be over the terminals of the chip, which are located on opposite sides of the chip. It is within the scope of the invention that both the vertical and the horizontal dimensions of the recess can be enlarged—for example, with a first wire being able to be moved in the horizontal direction to be over a first terminal of the chip and a second wire being able to be moved in the vertical direction to be over a second terminal of the chip (such as on an adjacent, rather than an opposite side of the chip). The same concept can be applied in the FIGS. 3A-3E and FIGS. 4A-4E embodiments—namely, having an oversize recess which is substantially larger in both orthogonal directions, and causing relative movement of the chip (by moving the chip and/or the substrate) to position the terminals of the chip to be under the wire bridges, for bonding thereto.

Generally, it can be seen that the recesses 306 and 406 have widths w6 and w8, respectively, which are substantially greater than the width (w5, w7) of the chip. The two end portions of the antenna wire span (bridge) the recess, and are spaced apart from one another a distance (s4, s6) which is greater than the width (w5, w7) of the chip, so that the chip can be inserted into the recess from the same side of the substrate as the antenna, past the end portions of the wires. Subsequently, the chip 308 or the substrate 404 is moved, from side-to-side, so that in a given position, each of the terminals of the chip is under a corresponding one of the end portions of the wires, and the end portions of the wire are bonded to the terminals.

In these two embodiments (moving the chip, moving the substrate), the wire is not "actively" or "directly" moved per se (such as with a wire gripper), but it moves ("indirectly") after being bonded to a chip (see FIGS. 3D and 4D, as well as FIGS. 3E and 4E). Generally, the recess is significantly wider than the chip in only one dimension (width), and the chip or substrate move from side-to-side to position two terminals disposed on opposite sides of the chip under two parallel wire bridges. It is within the scope of the invention that the terminals may be arranged differently on the chip, and that both the vertical and the horizontal dimensions of the recess can be enlarged—for example, so that the chip or the substrate can be moved in a first (such as horizontal) direction to position a first terminal under a first one of the wire bridges, and so that the chip or the substrate can be moved in a second (such as vertical) direction to position a second terminal under a second one of the wire bridges.

In order to interconnect a crossing wire ("wire bridge") to a terminal area on the chip or chip module, the substrate (or chip) is simply moved either right or left, resulting in the crossing wire to be exactly over the terminal area of a chip or chip module at each transponder site in the array. The crossing wire can be first treated with ultraviolet laser to remove the insulation, before bonding the section of un-insulated wire to the terminal area. Having completed the interconnection of one side of the cavity, the substrate is moved in the opposite direction, so as to align the second crossing wire over the terminal area of the chip or chip module at each transponder site in the array. Again, the wire insulation can be removed by laser and the un-insulated section of the wire is bonded to a terminal area.

As the substrate has index holes to fix its' position on the work plate, pins passing through the index holes can be moved to shift the substrate in either direction, so as to align the wire ends of the antenna over a terminal area of a chip or chip module.

A vision system (not shown) may be needed to ensure accurate positioning during relative movement of the chip.

Regarding thermode ageing, it should be understood that the conventional method to interconnect the wire ends of an antenna to the terminal areas of a chip module is by means of thermal compression bonding. The method makes use of heat by passing pulses of electric current through a thermode and simultaneously applying pressure to cause a diffusion process between the wire and the lead frame of the chip module. The main disadvantages of thermal compression bonding are the ageing of the thermode which requires regular replacement and residues of wire insulation remaining underneath the bonded wire which affects the long term reliability of the interconnection.

This thermode ageing problem can be exacerbated if the chip is not held securely in place, on a rigid work surface. The approach described hereinabove, with respect to FIGS. 4A-4E, provide an opportunity to keep the chip in a fixed position, while causing the aforementioned relative motion between the chip and the wire bridges to bring the terminals of the chip into position for bonding thereto.

Normally (such as may be exemplified by FIGS. 14 and 15 of U.S. Pat. No. 6,698,089), the chip is mounted into the recess first and then the wire is embedded in the substrate. The wires cross over the terminal areas of the chip and thus lie above the terminals. This means that the chip is supported by an underlying substrate. This can cause problems, as follows. Since the chip is supported by the underlying substrate (synthetic material) which is elastic, its surface is not ideal for the bonding process.

For a reliable interconnection and to prevent rapid ageing of the thermode during thermal compression bonding, the surface should be hard like ceramic. Therefore, the current technique of placing the chip in a recess before embedding or placing the chip from below is not conducive for a reliable interconnection in the next stage of the process. The number of bonds which can be achieved using the traditional method is 5,000, whereas with a ceramic plate (heated hot plate), the thermode can withstand 20,000 bonds.

Passive NFC (Near Field Communication) Inlay

An embodiment of the invention relates to a method for producing a passive contactless inlay or NFC inlay for use in a mobile (cell) telephone. The surface paint layer on the body of a stealth aircraft is designed to absorb and deflect radar. Using this stealth technology in a mobile phone, it is possible to absorb electromagnetic waves from the phone to protect an RFID chip or transponder from interference, but also to increase the read/write range in one direction. A number of patents describe how electromagnetic waves can be absorbed or deflected, namely U.S. Pat. Nos. 4,912,143, 5,094,907, 6,521,829 and 6,870,497.

The inlay for adhesive attachment to the casing or battery of a mobile phone can be produced as follows: firstly a graphite-ferrite microspheres based surface paint is applied to the bottom layer of the inlay with an adhesive backing, Secondly an antenna is embedded into another layer of material with adhesive backing and the wires ends of the antenna are connected to an RFID chip.

This simple two layer construction with adhesive backing on the bottom layer and in the middle of the two layers allows for interference free communication between the transponder and external RFID reader.

The size of the inlay can be 3 by 5 centimeters and the read/write range with the noise absorption and reflective layer can be 5 cm. The RFID chip can be located on the inlay or on the motherboard in the telephone.

Direct Connection (FIGS. 5A-5B)

The technique to encapsulate a chip (die) in a thermoset plastic package is commonly known as transfer molding. The molding material is highly filled epoxy primarily consisting of sand and glue, and also soot to protect the die from ultraviolet light as well as antistatic, flame retardant (e.g. red phosphorous) and anti-stick (e.g. wax) compounds.

According to an embodiment of the invention, a transfer molding technique is used, not for chip package encapsulation, but to hold the die in a fixed position in a housing during the direct connection of the wire ends of an antenna to the aluminum pads on a silicon device or to bumps mounted on the aluminum pads.

FIGS. 5A and 5B illustrate a chip housing 500 with an opening 526 to accept a die 508, and may be used to replace a conventional chip module in manufacturing a transponder inlay. The die 508 is shown with two metalized bumps 508*a* and 508*b* on its front (top, as viewed) surface. The chip may have a generally rectangular shape, and the chip housing 500 may have a similar (but larger) generally rectangular shape.

A substantially planar base portion 524 of the chip housing 500 has a first dimension "x1" which may measure 5 mm, and a second dimension "y1" which may measure 5 mm, and has a thickness ("z1") which may measure 100 μm (0.1 mm). The thickness of the base portion 524 is intended to correspond (be substantially equal) to the thickness of the bottom layer(s) 504*b* (compare 104*b*) of a multi-layered inlay 504 (compare 104). These, and other dimensions set forth herein, are exemplary, and may vary with different applications and configurations.

A wall portion 522 has four walls and protrudes from the top surface of the base portion 524, and is sized and shaped to surround a bare die 508. For example, a die 508 may measure 1 mm×1 mm, and have a thickness of 150 μm (0.15 mm). The opening 526 is shown, formed by the four walls of the wall portion 522.

The four walls of the wall portion 522 rise from the base 524 and "frame" the die 508. The width and length of the wall portion 522 depends on the size of the die. The four walls may each have a thickness of approximately 0.5 mm (500 μm), so that the wall portion 522 has an overall first dimension "x1" measuring 2 mm, and an overall second dimension "y2" measuring 2 mm. The support portion may have a height ("z2") of 200 μm (0.2 mm), which is intended to correspond (be substantially equal) to the thickness of the upper layer(s) 504*a* (compare 104*a*) of the multi-layered inlay 504.

As best viewed in FIG. 5A, protruding from the center of the base portion 524, within the wall portion 522, is a support portion 528 upon which the die 508 may be supported. The height of the support portion (200 μm) including the underlying base portion (100 μm) is approximately equal to the thickness of the inlay (300 μm), before this inner sandwich is laminated with a top and bottom layer. A hole 529 may be provided from the bottom of the base portion 524 through the center of the support portion 528 to allow for the passage of a heating element or for dispensing a substance. The support portion 528 may be formed integrally with the base and wall portions, or may be an insert disposed within the opening 526.

As mentioned above, the housing 500 has a wall portion 522 extending vertically from the base portion 524. Top surfaces of the wall portion 522 are provided with grooves within which end portions 510*a* and 510*b* (compare 210*a/b*, 310*a/b*, 410*a/b*) may be positioned prior to disposing h the chip 508 in the opening 526. The opening 526 corresponds to the aforementioned recesses (206, 306, 406), and the end portions 510*a* and 510*b* of the antenna wire 510 span (bridge) the opening 526, and are spaced sufficiently wide apart that the chip may be inserted past the end portions 510*a* and 510*b* of the wire 510, into the opening 526. Initially, the end portions 510*a* and 510*b* of the wire 510 are "pre-positioned" and may be located in a pair of grooves 530*a* and 530*b* which extend across the top surface of the housing portion 522.

The grooves 530*a* and 530*b* may be generally semi-circular, and extend in parallel across the top surface of the housing portion 522, spaced a distance (s8) apart which is greater than a corresponding dimension (w9) of the chip 508. With the end portions 510*a* and 510*b* of the antenna wire 510 disposed in this first set of grooves 530*a* and 530*b*, and if these grooves are over the opening, the laser may be used to remove insulation from the end portions 510*a* and 510*b* of the antenna wire 510, before positioning the wire ends of the antenna into a second set of grooves 532a and 532b which are spaced a distance (s9) apart so as to be over the terminal areas of the chip 508. During insulation removal, reflective material such as a mirror can be used to ensure that the insulation is completely removed from all sides of the wire conductor.

This embodiment 500 is most similar to the embodiment 200 in that the opening (or recess) is only slightly larger than the chip, and the end portions of the wire (wire bridges) are directly moved from an initial position which is wider than a width dimension of the chip (or chip module) to a final position which is narrower and places the wire bridged over the terminals of the chip for bonding thereto. In the embodiments 300 and 400, the wire bridges are also initially placed at an initial position which is wider than a width dimension of the chip, but the recess was oversize to allow for relative motion of the chip within the recess to position terminals of the chip under corresponding ones of the wire bridges for bonding thereto.

The procedure to produce an inlay with an array of transponder sites is as follows: Firstly, a cavity is punched at each transponder site in the bottom layer(s) of an inlay sheet or substrate to accommodate the base of the chip housing and cavities are also punched through the inner layers to accommodate the support; Secondly, slots on each side of a cavity can be provided in the top layers of the inlay to allow for easy manipulation of the wires in bringing them into position over the terminal areas of the chip; thirdly, a chip housing is inserted into the inlay at each transponder site and supported by an underlying layer; fourthly, an antenna is mounted at each transponder site in the array, passing the antenna wire over the slots and aligning the wire ends of the antenna adjacent to the cavity containing the chip housing; fifthly, in preparation for interconnection, the insulation from the wire ends of the antenna is removed; and finally, a chip is placed in the recess at the apex of the housing and the un-insulated wires are aligned over the terminal areas for bonding.

Tools (FIGS. 6A-6B)

The use of some tools has been mentioned, to implement the methods disclosed herein for mounting an antenna wire on a substrate with end portions of the wire (wire bridges) spanning a recess and spaced sufficiently apart from one another that a transponder chip may be disposed in the recess after the antenna wire is mounted. A suitable tool for mounting the wire to the substrate is shown in U.S. Pat. No. 6,698,089, and need not be discussed further herein. The use of a laser for removing insulation from the wire bridges has been discussed. The use of a hook or gripper for grabbing and repositioning the wire has been discussed.

FIG. 6A illustrates a technique for removing insulation from wire bridges, according to an aspect of the invention. A substrate 604 (compare 204, 304, 404) has a recess 606 (compare 206, 306, 406), which may include slots (207a, 207b). End portions 610a and 610b (compare 210a/b, 310a/b, 410a/b), which are "wire bridges", span the recess 606 (or slots). Prior to installing a chip (not shown, see 208, 308, 408) into the recess 606, a laser 630 (such as a UV laser) may be used to direct a beam of light 631 at the wire bridges 610a and 610b, to remove any insulating material (coating, such as enamel) therefrom, to enhance subsequent bonding to terminals of the chip, as discussed hereinabove.

FIG. 6B illustrates a technique for repositioning wire bridges, such as discussed hereinabove with respect to FIGS. 2A-2B.

A substrate 654 (compare 204) has a recess 656 (compare 206) extending through upper layers 654a (compare 104a) thereof, and slots 657a and 657b 656 (compare 207a and 207b) extending from opposite side edges of the recess 656 completely through the substrate 654, including bottom layers 654b (compare 104b) thereof. Wire bridges 660a and 660b (compare 210a and 210b) extend across the slots 657a and 657b.

After installing a chip 658 (compare 208) in the recess 656 (and after removing insulation from the wire bridges) a hook 640 (gripper tool, or multiple gripper tools, as described hereinabove) is used to grab the wire bridges and move them over to be atop corresponding ones of the terminals 658a and 658b of the chip 658.

In FIG. 6B, the hook 640 is shown getting ready to grab the wire bridge 660b, then drag it over to its new location (shown in dashed lines) atop the terminal 658b, for bonding thereto, as indicated by the arrow 642. The wire bridge 660a will be (or already is) similarly repositioned above the terminal 658a, for bonding thereto.

Generally speaking, the tools used to perform the methods described herein are not new, rather they are well known and readily available. Some tools have been described hereinabove. Die bonders (such as Kulike and Soffa, Willow Grove, Pa.) use many of the same tools and techniques, such as suction pipette, heated work plate, and the like.

Description of a Manufacturing Flow

Various methods have been described hereinabove relating to mounting an antenna wire on a substrate with end portions of the wire (wire bridges) spanning a recess and spaced sufficiently apart from one another that a transponder chip may be disposed in the recess after the antenna wire is mounted. This allows for inserting the transponder chip into the recess after the antenna wire is mounted, as well as for removing insulation from the wire bridges using a laser, before the transponder chip is mounted in the recess. After insulation is removed from the wire bridges, and the transponder chip is installed in the recess, the wire bridges may be interconnected (bonded) to the terminals of the transponder chip (or chip module).

FIG. 7 illustrates a manufacturing flow 700, showing a possible organization for the various manufacturing steps set forth hereinabove.

In a first step 702, a substrate is prepared. The substrate may have one or more (an array of) inlay sites. The substrate may be a multi-layer substrate, as discussed above. A given inlay site may have a recess (cavity, window) and may have slots, as described above. Substrates may be prepared well ahead of time, "off-line".

In a next step 704, and antenna wire is mounted to (embedded in, adhesively placed on) the substrate, as discussed above, with end portions of the wire spanning a recess (or cavity, or window), as discussed hereinabove.

Two mounting procedures have been discussed hereinabove—(1) embedding the wire in the surface of the substrate, and (2) "adhesively positioning" a self-bonding wire to the surface of the substrate. In a next step 706, which can be skipped if the wire is being embedded in rather than adhesively placed on the substrate, the self-bonding wire may be cured to the substrate, such as by using ultraviolet light.

In a next step 708, which can be skipped if the wire is not insulated, the insulation is removed from the wire bridges spanning the recess, as discussed hereinabove. It is within the scope of the invention that the insulation may be removed from portions of the wire corresponding to the wire bridges prior to mounting the antenna wire to the substrate and forming the bridges.

In a next step 710, the transponder chip is installed on the inlay substrate, into the recess, past the wire bridges which are spaced sufficiently apart to allow the chip to be installed past the wire bridges. Alternatively, the chip may be installed from the opposite side of the substrate into a recess (window) extending completely through the substrate.

It should be understood that the substrate may be set up for a plurality of inlays, receiving a plurality of transponder chips, such as a 3×6 array of inlays.

Next, using one of the techniques described hereinabove, the wire bridges are positioned over the respective terminals of the chip (or vice-versa). This is shown by steps 712a, 712b, and 712c.

In the step 712a, the wire bridges are re-positioned to be over the terminals of the chip, and the wires are bonded to the terminals, such as described hereinabove with respect to FIGS. 2A-2B.

In the step 712b, the chip is moved from side-to-side to position its terminals under the corresponding wire bridges, and the wires are bonded to the terminals, such as described hereinabove with respect to FIGS. 3A-3E.

In the step 712c, the substrate is moved from side-to-side to position the chip's terminals under the corresponding wire bridges, and the wires are bonded to the terminals, such as described hereinabove with respect to FIGS. 4A-4E.

Next, in a step 716, various post-processing steps may be performed, such as assembling the transponder inlay with additional layers of sheets in preparation for lamination In a step 718, if there are a plurality of inlays on a common substrate, they may be singulated (separated) from the substrate.

In a step 720, various post-processing steps applicable to individual secure inlays may be performed.

Generally, each of the steps discussed hereinabove may be performed at a different station, or stations, in a manufacturing environment. This has various advantages, such as improved yields from the manufacturing process and greater throughput from the embedding machine with fewer operators.

One of ordinary skill in the art will readily understand how this, or other steps recited in this "fab flow" may be rearranged, recombined and/or omitted to suit particular circumstances, based on the teachings set forth herein.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. Method of connecting an antenna wire to a transponder chip comprising:
   providing a recess in a surface of a substrate;
   mounting the antenna wire to the surface of the substrate so that two end portions of the antenna wire span the recess;
   characterized by:
   the end portions of the antenna wire are spaced a distance apart from one another which is greater than a width dimension of the transponder chip;
   after the antenna wire is mounted to the surface of the substrate, inserting the transponder chip into the recess, past the two end portions of the antenna wire, wherein the two end portions of the antenna wire form wire bridges on each side of the transponder chip; and
   subsequently repositioning the end portions so that the two end portions of the antenna wire are located directly over corresponding two terminals of the transponder chip;
   further comprising:
   providing slots under the end portions of the antenna wire to allow the end portions to be gripped for repositioning.

2. The method of claim 1, further comprising:
   interconnecting the two end portions of the antenna wire to the corresponding two terminals of the transponder chip.

3. The method of claim 1, wherein:
   the chip has a width dimension; and
   the recess has a width dimension which is significantly greater than the width dimension of the chip, including at least 20% greater, at least 25% greater, at least 30% greater, at least 40% greater, at least 50% greater, at least 60% greater.

4. Method of connecting an antenna wire to a transponder chip comprising:
   providing a recess in a surface of a substrate;
   mounting the antenna wire to the surface of the substrate so that two end portions of the antenna wire span the recess;
   characterized by:
   the end portions of the antenna wire are spaced a distance apart from one another, wherein the distance is greater than a width dimension of the transponder chip;
   disposing the transponder chip in the recess after the antenna wire is mounted to the surface of the substrate;
   repositioning at least one of the end portions so that the two end portions are located directly over corresponding two terminals of the transponder chip;
   imparting a first relative motion between the chip and the substrate so that the first terminal of the chip is positioned under the first end portion of the wire, and bonding the first end portion of the wire to the first terminal of the chip; and
   imparting a second relative motion between the chip and the substrate so that the second terminal of the chip is positioned under the second end portion of the wire, and bonding the second end portion of the wire to the second terminal of the chip.

5. The method of claim 4, further comprising:
   imparting a third relative motion between the chip and the substrate to center the chip in the recess.

6. The method of claim 4, wherein:
   the first and second relative motions are imparted by moving the chip relative to a stationary substrate.

7. The method of claim 4, wherein:
   the first and second relative motions are imparted by moving the substrate relative to a stationary chip.

8. The method of claim 4, further comprising:
   removing insulation from the wire prior to bonding.

9. The method of claim 4, wherein:
   the chip has a width dimension; and
   the recess has a width dimension which is significantly greater than the width dimension of the chip, including at least 20% greater, at least 25% greater, at least 30% greater, at least 40% greater, at least 50% greater, at least 60% greater.

10. The method of claim 4, further comprising:
    interconnecting the two end portions of the antenna wire to the corresponding two terminals of the transponder chip.

11. Method of connecting an antenna wire to a transponder chip comprising:
    providing a recess in a surface of a substrate;
    mounting the antenna wire to the surface of the substrate so that two end portions of the antenna wire span the recess;

disposing the transponder chip in the recess, between the two end portions of the antenna wire; and imparting at least one relative motion between the chip and the substrate so that a first terminal of the chip is positioned under a first of the two end portions of the wire for bonding thereto and so that a second terminal of the chip is positioned under a second of the two end portions of the wire for bonding thereto;

further comprising:

providing slots under the end portions of the antenna wire to allow the end portions to be gripped for repositioning.

12. The method of claim 11, further comprising:
interconnecting the two end portions of the antenna wire to the corresponding two terminals of the transponder chip.

13. The method of claim 11, further comprising:
using a wire gripper to reposition the end portions of the antenna wire.

14. The method of claim 11, further comprising:
removing insulation from at least the end portions of the wire prior to bonding.

15. The method of claim 11, wherein:
the transponder chip has a width dimension; and
the recess has a width dimension which is significantly greater than the width dimension of the transponder chip, including at least 20% greater, at least 25% greater, at least 30% greater, at least 40% greater, at least 50% greater, at least 60% greater.

16. The method of claim 11, wherein:
the substrate comprises a multi-layer substrate.

17. Method of connecting an antenna wire to a transponder chip comprising:

providing a recess in a surface of a substrate;

mounting the antenna wire to the surface of the substrate so that two end portions of the antenna wire span the recess;

disposing the transponder chip in the recess, between the two end portions of the antenna wire; and imparting at least one relative motion between the chip and the substrate so that a first terminal of the chip is positioned under a first of the two end portions of the wire for bonding thereto and so that a second terminal of the chip is positioned under a second of the two end portions of the wire for bonding thereto;

wherein:

the relative motion is imparted by moving the chip relative to a stationary substrate.

18. The method of claim 17, wherein:
the substrate comprises a multi-layer substrate.

19. Method of connecting an antenna wire to a transponder chip comprising:

providing a recess in a surface of a substrate;

mounting the antenna wire to the surface of the substrate so that two end portions of the antenna wire span the recess;

disposing the transponder chip in the recess, between the two end portions of the antenna wire; and imparting at least one relative motion between the chip and the substrate so that a first terminal of the chip is positioned under a first of the two end portions of the wire for bonding thereto and so that a second terminal of the chip is positioned under a second of the two end portions of the wire for bonding thereto;

wherein:

the relative motion is imparted by moving the substrate relative to a stationary chip.

20. The method of claim 19, wherein:
the substrate comprises a multi-layer substrate.

\* \* \* \* \*